United States Patent
Uchinuma et al.

(10) Patent No.: US 11,373,941 B2
(45) Date of Patent: Jun. 28, 2022

(54) SENSE MOSFET ELECTRICALLY CONNECTED TO A SOURCE PAD VIA A PLURALITY OF SOURCE EXTRACTION PORTS

(71) Applicant: RENESAS ELECTRONICS CORPORATION, Tokyo (JP)

(72) Inventors: Yoshimasa Uchinuma, Tokyo (JP); Yusuke Ojima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 61 days.

(21) Appl. No.: 17/068,446

(22) Filed: Oct. 12, 2020

(65) Prior Publication Data
US 2022/0115306 A1    Apr. 14, 2022

(51) Int. Cl.
*H01L 23/495*    (2006.01)
*H01L 23/48*     (2006.01)
*H01L 21/00*     (2006.01)
*H05K 7/18*      (2006.01)
*H01L 23/31*     (2006.01)
(Continued)

(52) U.S. Cl.
CPC .... *H01L 23/49568* (2013.01); *H01L 23/3114* (2013.01); *H01L 23/4952* (2013.01); *H01L 23/49513* (2013.01); *H01L 23/49524* (2013.01); *H01L 23/49562* (2013.01); *H01L 24/37* (2013.01); *H01L 27/088* (2013.01); *H01L 24/06* (2013.01); *H01L 24/29* (2013.01); *H01L 2924/13091* (2013.01)

(58) Field of Classification Search
CPC ........... H01L 2924/13091; H01L 24/29; H01L 24/06; H01L 24/37; H01L 27/088; H01L 23/49568; H01L 23/3114; H01L 23/49513; H01L 23/4952; H01L 23/49524; H01L 23/29562
See application file for complete search history.

(56) References Cited

U.S. PATENT DOCUMENTS 9,704,979 B2 *  7/2017  Muto .................. H01L 29/7805
10,031,164 B2   7/2018  Takada et al.
(Continued)

FOREIGN PATENT DOCUMENTS

JP    2017-069412 A    4/2017

*Primary Examiner* — Alonzo Chambliss
(74) *Attorney, Agent, or Firm* — McDermott Will & Emery LLP

(57) ABSTRACT

A semiconductor device includes a semiconductor chip, first and second source terminals and a Kelvin terminal, wherein the semiconductor chip includes a first source electrode coupled to the first source terminal through a first connecting portion, a second source electrode coupled to the second source terminal through a second connecting portion, a Kelvin pad coupled to the Kelvin terminal and formed independently of the first source electrode, a power MOSFET that has a source coupled to the first source electrode, a sense MOSFET that has a source coupled to the second source electrode, a source pad formed on a portion of the first source electrode and coupled to the first connecting portion, a plurality of source potential extraction ports formed around a connection point between the first connecting portion and the source pad and a plurality of wires coupled between the source potential extraction ports and the Kelvin pad.

13 Claims, 23 Drawing Sheets

(51) Int. Cl.
*H01L 27/088* (2006.01)
*H01L 23/00* (2006.01)

(56) References Cited

U.S. PATENT DOCUMENTS

| | | | | |
|---|---|---|---|---|
| 2008/0054422 A1* | 3/2008 | Koike | ............. | H01L 24/49 |
| | | | | 257/676 |
| 2013/0181228 A1* | 7/2013 | Usui | ............. | H01L 24/40 |
| | | | | 257/E21.705 |
| 2014/0015046 A1* | 1/2014 | Thiele | ............. | H01L 29/7815 |
| | | | | 257/334 |
| 2016/0064312 A1* | 3/2016 | Bando | ............. | H01L 23/49575 |
| | | | | 438/119 |
| 2021/0118781 A1* | 4/2021 | Hasegawa | ......... | H01L 23/49568 |

* cited by examiner

FIG. 11

| CONNECTION POSITION | CENTER | Y: +0.15 mm | Y: -0.15 mm |
|---|---|---|---|
| POINT A | 0.380 | 0.449 | 0.315 |
| POINT B | 0.233 | 0.240 | 0.241 |
| POINT C | 0.299 | 0.239 | 0.375 |
| POINT D | 0.236 | 0.241 | 0.239 |
| AVE. A-D | 0.287 | 0.2923 | 0.2925 |
| VOL. FLUCTUATION (A) | - | +18.2% | -17.1% |
| VOL. FLUCTUATION (AVE. A-D) | - | +1.8% | +1.9% |

[mV]

US 11,373,941 B2

SENSE MOSFET ELECTRICALLY CONNECTED TO A SOURCE PAD VIA A PLURALITY OF SOURCE EXTRACTION PORTS

BACKGROUND

The present invention relates to a semiconductor device, particularly a semiconductor device and a control system having a power semiconductor device.

For power tools and mobile devices equipped with a control circuit for battery charging and discharging, power conditioners equipped with an inverter circuit, UPS, motor control circuit, etc., power semiconductor devices are used. As a power semiconductor device, a power MOSFET or an IGBT (Insulated Gate Bipolar Transistor) is used.

For a semiconductor device using a power MOSFET (or IGBT), to control the current flowing from the power MOSFET to the load and to detect the short-circuit failure of the load, it is essential to detect the current flowing from the power MOSFET to the load. A sensing MOSFET coupled in parallel with a power MOSFET is widely used to detect the current flowing from the power MOSFET to the load. By configuring a circuit so that the current flowing in the sense MOSFET is a predetermined ratio (sense ratio) with respect to the current flowing in the power MOSFET, the current value flowing in the power MOSFET can be converted from the current value of the sense MOSFET.

Patent Document 1 discloses that the sense ratio depends on the gate-voltage of the power MOSFET (sense MOSFET). More specifically, as the gate voltage increases, the sense ratio drops, and when the gate voltage reaches some magnitude, the sense ratio saturates at a predetermined value. That is, since the sense ratio varies with the gate voltage, an error occurs in the current value of the power MOSFET converted from the current value flowing in the sense MOSFET. In Patent Document 1, the source electrode is provided with slits, and the slits are arranged between the source pad and the Kelvin pad, thereby suppressing a detecting error.

PRIOR-ART DOCUMENT

Patent Document

[Patent Document 1] Japanese Unexamined Patent Application Publication No. 2017-69412

SUMMARY

In a conventional semiconductor device using a power MOSFET (or IGBT), source pads (PDS1a, PDDS1b) are provided on the source electrode (ES1) as shown in FIGS. 3 and 10 of Patent Document 1, for example. The lead (LD) and the source pad are connected by a wire (WA). Wires are connected by a wire bonding device, but errors in the wire bonding device cause variations in the connecting positions between the two or more semiconductor devices. In addition, in recent semiconductor device, a metal plate called a clip is sometimes used instead of wires to reduce resistances of the wires. Metal plate as well as the case of wires, there may be variations in the connection position. The inventors of the present application have found that variations in the sense ratio occur due to variations in the connection position of the wire or the metal plate.

Further description will be made with reference to FIG. 23. FIG. 23 is a schematic diagram of a prior art semiconductor device. The drain terminal (DT) is connected to the drain of the power MOSFET (Tr1) and the sense MOSFET (Tr2). The source of Tr1 is connected to the source terminal (ST1) and the Kelvin terminal (KT). The source of Tr2 is connected to the source terminal ST2.

RD represents a metal resistance of the drain pad. RL1, RL2 represent metal resistances of the leads. RW1, RW2 represent metal resistances of the wires. RS1, RS2 represent resistance values of the current paths extending in an XY plane in the source electrode from the connection position of the wire (resistance values of the current paths from the connection position of the wire to Tr1, Tr2).

RS1 has a variable resistor because the wire connecting position varies among several semiconductor devices. Unless the connecting positions of the wires become constant, RS1 does not become constant.

The sense ratio will now be considered. The sensing ratio is determined by the ratio of the current flowing through Tr1 to the current flowing through Tr2, as also described in Patent Document 1. Considering that KT and ST2 are at the same potential by the operation of the current detecting circuit unit DKC, the sensing ratio can be defined as RDS2(on)/RDK(on) (Equation 1). Where RDS2(on) is a resistance between DT and ST2 when Tr2 is on. RDK(on) is a resistance between DT and KT when Tr1 is on and current is flowing in the DT and ST1.

Since the Kelvin terminal KT is formed on the source electrode, the potential of KT can be said to be a potential taken out from a portion of RS1 (arrow in FIG. 23). Measuring a voltage using the Kelvin terminal, i.e. measuring a voltage by the four-terminal method, the voltage that is not affected by a part of the resistor of RS1 is measured. If the unaffected resistance part is Rcancel and the on-resistance of Tr1 is RTr1, RDK(on) is RD+RTr1+RS1−Rcancel (Equation 2). Rcancel is determined by the connecting position of the wire and the position of the Kelvin pad.

If the on-resistance of Tr2 is RTr2, then RDS2(on) is RD+RTr2+RS2+RW2+RL2 (Equation 3). Here, since RTr2 is generally very large (several $\Omega$ to several tens of $\Omega$), (Equation 3) can be approximated to RTr2. When thin wires are used for cost reduction or the like, Equation 3 may be approximated to RTr2+RW2. On the other hand, since RTr1 is a sufficiently small value (several m$\Omega$ or less), a value other than RTr1 of Equation 2 cannot be ignored. Therefore, (Equation 1) is RTr2/(RD+RTr1+RS1−Rcancel) (Equation 4).

As is evident from Equation 4, it can be seen that the sense ratio also varies due to variations in the connection position of the wire or the metal plate.

Other objects and novel features will become apparent from the description of the specification and drawings.

A semiconductor device according to an embodiment includes a semiconductor chip, first and second source terminals, a drain terminal, a gate terminal and a Kelvin terminal, wherein the semiconductor chip includes a first source electrode coupled to the first source terminal through a first connecting portion, a second source electrode coupled to the second source terminal through a second connecting portion, a drain electrode coupled to the drain terminal, a Kelvin pad coupled to the Kelvin terminal and formed independently of the first source electrode, a power MOSFET that has a source coupled to the first source electrode, a drain coupled to the drain electrode and a gate coupled to the gate terminal, a sense MOSFET that has a source coupled to the second source electrode, a drain coupled to the drain electrode and a gate coupled to the gate terminal, a source pad formed on a portion of the first source electrode and coupled to the first connecting portion, a plurality of source potential extraction ports formed around a connection point between the first connecting portion and the source pad and a plurality of wires coupled between the source potential extraction ports and the Kelvin pad.

Semiconductor device according to an embodiment allows the current flowing through the power MOSFET (or IGBT) to be measured with high accuracy.

BRIEF DESCRIPTION OF THE DRAWINGS

FIG. 11 is a table showing a voltage value of the semiconductor chip according to the first embodiment.

DETAILED DESCRIPTION

Figure 1:
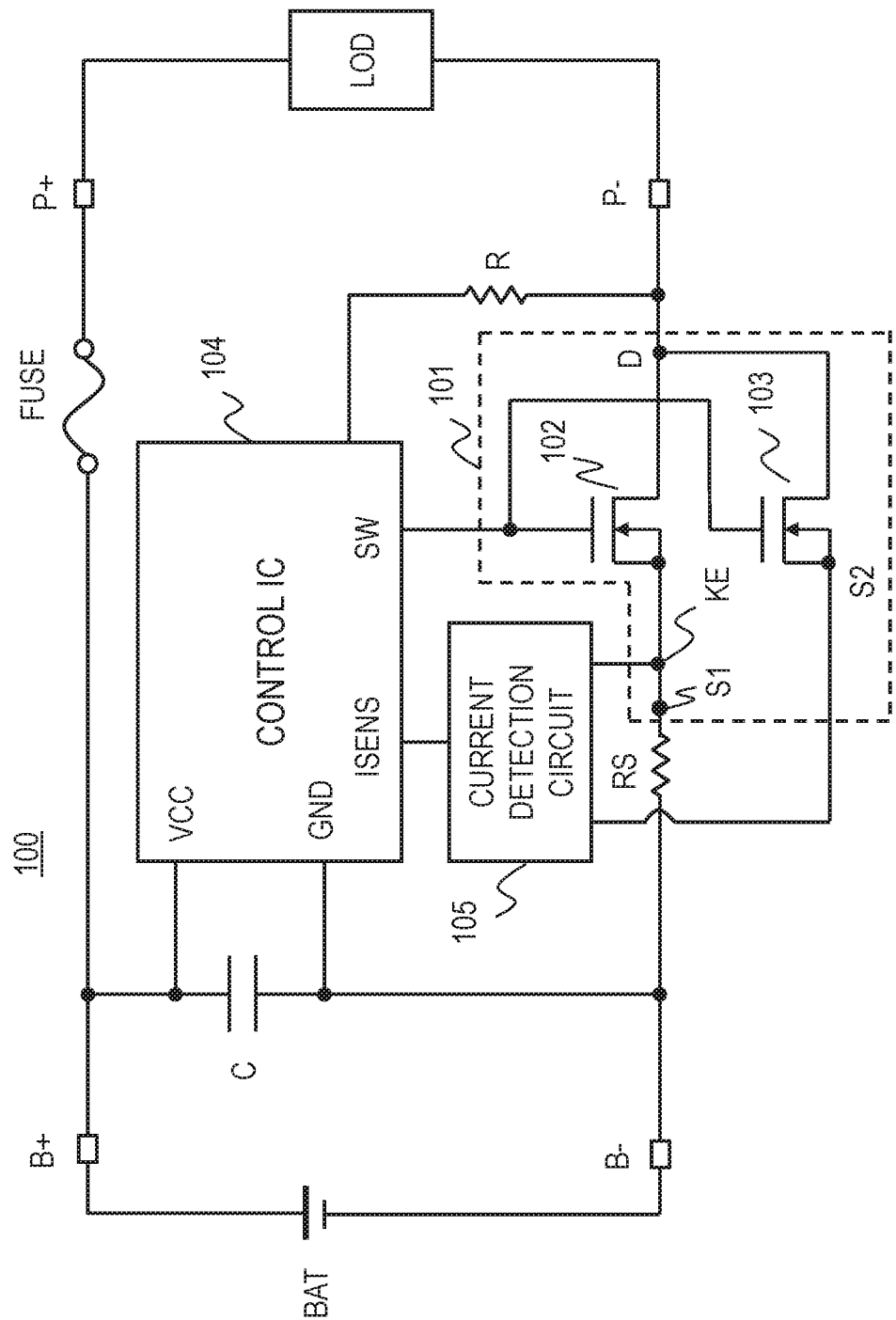
FIG. 1 is a block diagram of a control system according to a first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram illustrating a configuration of a control system 100 using a power MOSFET (or IGBT) and a sense MOSFET. Here, a battery protection system for LiB (Lithium Ion Battery) will be described as an example.

As shown in FIG. 1, the control system (battery protection system) 100 is a system for supplying power from a battery (BAT) connected between terminals B+, B− to a load (LOD) such as a motor connected between terminals P+ and P− or for charging the battery by receiving power from a load. The battery protection system 100 includes a semiconductor device 101, a control IC 104, a current detection circuit 105, a capacitor C, a resistor RS, R, and a fuse. Capacitor C is a device for power supply voltage stabilization of the control IC 104. Resistor RS is an element for current detection. Resistor R is an ESD protection element. The fuse is an element for overcurrent protection.

Semiconductor device 101 is composed of a semiconductor chip 200 having a power MOSFET 102 and a sense MOSFET 103. Here, a path between the terminals B+ and P+ is referred as a high-side wiring. Also, a path between the terminals B− and P− is referred as a low side wiring. The power MOSFET 102 and the sense MOSFET 103 are coupled in parallel on the low side wire. And, the power MOSFET 102 and the sense MOSFET 103 constitute a current mirror circuit. D is a drain terminal. S1 is a source terminal of the power MOSFET 102. S2 is a source terminal of the sense MOSFET 103. KE is a Kelvin terminal of the power MOSFET 102. Incidentally, FIG. 1 shows a configuration for performing discharge current control from the battery (BAT) to the load (LOD). When respective sources of the power MOSFET 102 and the sense MOSFET 103 are coupled to the terminal P−, and respective drains of the power MOSFET 102 and the sense MOSFET 103 are coupled to the terminal B−, the configuration is performing charge current control. Whichever configuration is used, present embodiment is applicable.

The control IC 104 is an IC that controls the power supply to the load and the charge to the battery, and generates a gate signals of the power MOSFET 102 and the sense MOSFET 103.

Current detection circuit 105 coupled to the terminal KE and the terminal S2 is for detecting a current value flowing through the sense MOSFET 103. The detected current value is transmitted to the control IC 104. The control IC 104, when the current detection circuit 105 detects an overcurrent or the like, shuts off the current by turning off the gate of the power MOSFET 102.

Figure 2:
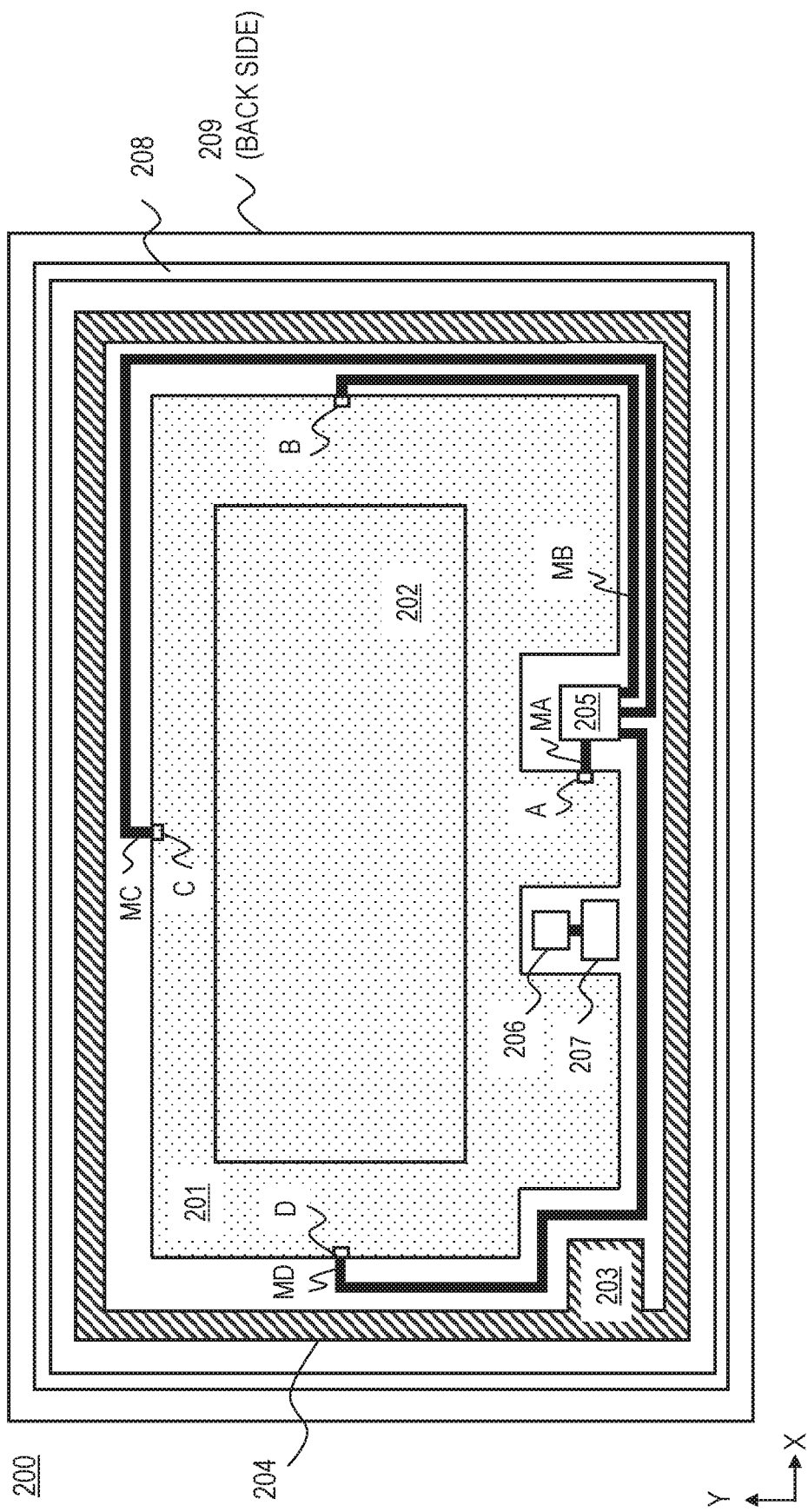
FIG. 2 is a plan view of a semiconductor chip according to the first embodiment.

Next, a configuration of the semiconductor chip 200 will be described with reference to FIG. 2. FIG. 2 is a plan view of the semiconductor chip 200 with a state where an insulating film is transparent for simplicity of understanding. Semiconductor chip 200 is a vertical power MOSFET. The source electrode and the gate electrode are formed on the surface of the semiconductor chip 200 (first surface), and the drain electrode is formed on the back surface (second surface) of the semiconductor chip 200. The drain electrode is a metal layer made of Au or Ag. As shown in FIG. 2, most of the semiconductor chip 200 is covered with the source electrode 201 of the power MOSFET 102. The power MOSFET 102 is formed below the source electrode 201. The source pad 202 of the power MOSFET 102 is formed on the source electrode 201 (insulating film opening of the source electrode 201). The Kelvin pad 205 of the power MOSFET 102 is a characteristic part of the present first embodiment and will be described in more detail below. The sense MOSFET 103 is formed beneath the source-electrode 207 of the sense MOSFET 103. A source pad 206 of the sense MOSFET 103 is formed adjacent to the source electrode 207. The source pad 206 is smaller in size than the source pad 202. A gate line 204 is formed to surround the power MOSFET 102 and sense MOSFET 103. A gate pad 203 is formed to connect to the gate line 204. A guard ring 208 is formed around the semiconductor chip 200. Drain pad 209 is formed on the back surface of the semiconductor chip 200.

Next, the Kelvin pad 205, which is a characteristic of the present first embodiment, will be described. As shown in FIG. 2, the Kelvin pad 205 is not formed on the source electrode 201 (unlike the prior art) but is formed away from (independent of) the source electrode 201. The source electrode 201 is provided with source potential outlets A to D so as to surround the source pad 202. Since the metal plate (or wire), which will be described later, is connected to the source pad 202, the source potential extraction ports A to D will be formed around the connection point of the metal plate (or wire). In FIG. 2, the source pad 202 has a rectangular shape. The source potential extraction ports A to D are provided at the end portions of the source electrode 201 corresponding to the four sides of the source pad 202. Source potential extraction port A is connected to the Kelvin pad 205 with wiring MA. Similarly, the source potential extraction ports B to D are connected to the Kelvin pad 205 by wires MB to MD, respectively. Wiring MA-MD are provided between the gate line 204 and the source electrode 201.

Resistance value of each of wirings MA to MD may be any value. However, in practice, when detecting the current flowing through the sense MOSFET 102, a current of about 1 to 10 µA flows. The potential read by the current detection circuit 105 is assumed to be 200 mV, and the detection current is assumed to be 10 µA. If each of the wiring resistances of the wirings MA to MD is 20Ω, the voltage read by the current detection circuit 105 will include an error of 0.1%. If each of the wiring resistances of the wires MA to MD is 2Ω, the voltage read by the current detection circuit 105 will include an error of 0.01%. Therefore, the smaller the wiring resistances of the wires MA to MD that do not interfere with the performance of RDS1 (on), the smaller the effect on the current detection accuracy. Each of the wiring resistances of the wirings MA to MD is preferably a resistance value of approximately 10Ω or less.

Figure 3:
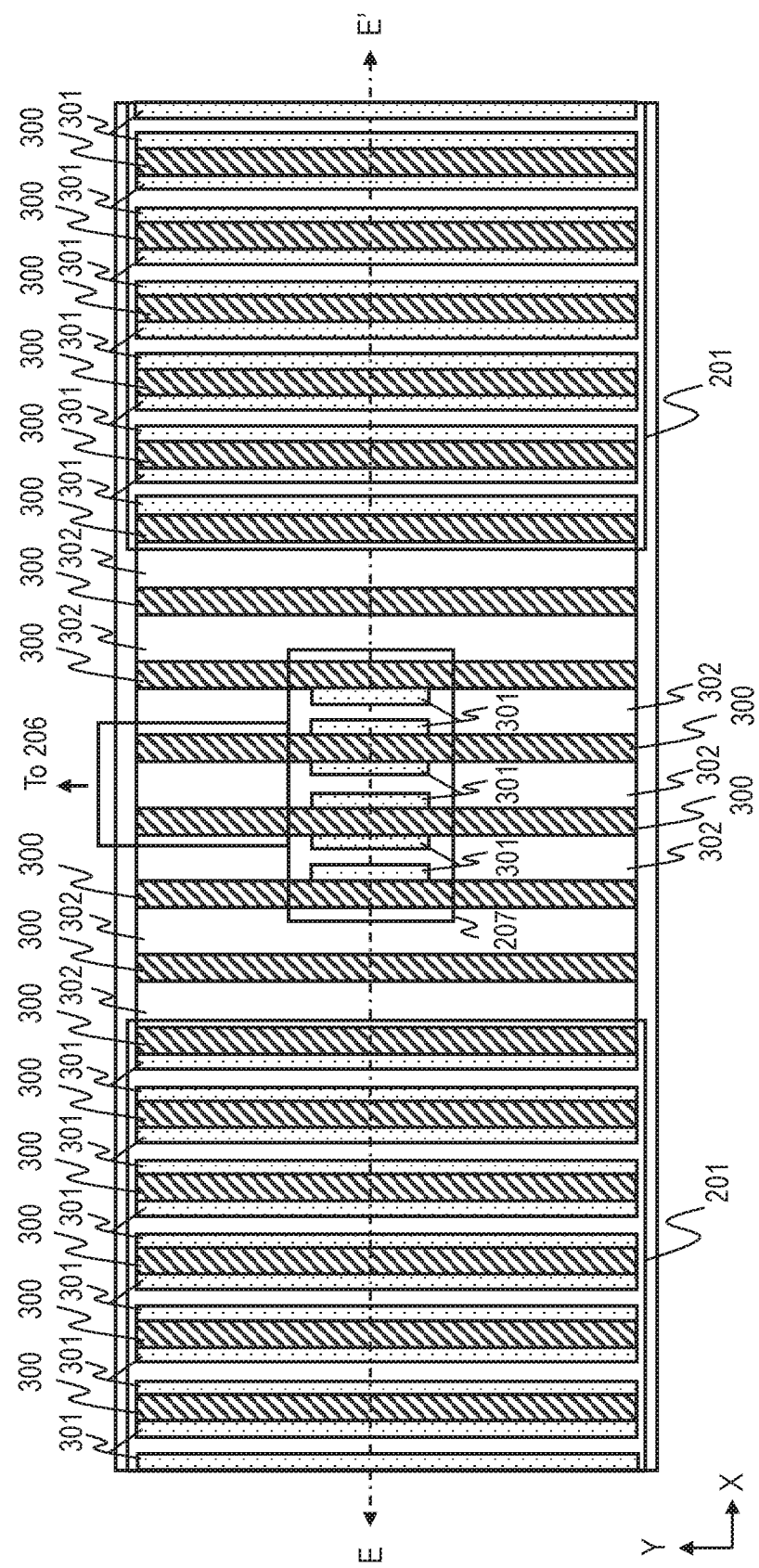
FIG. 3 is a structural diagram of a sensing MOSFET according to the first embodiment.
Figure 4:
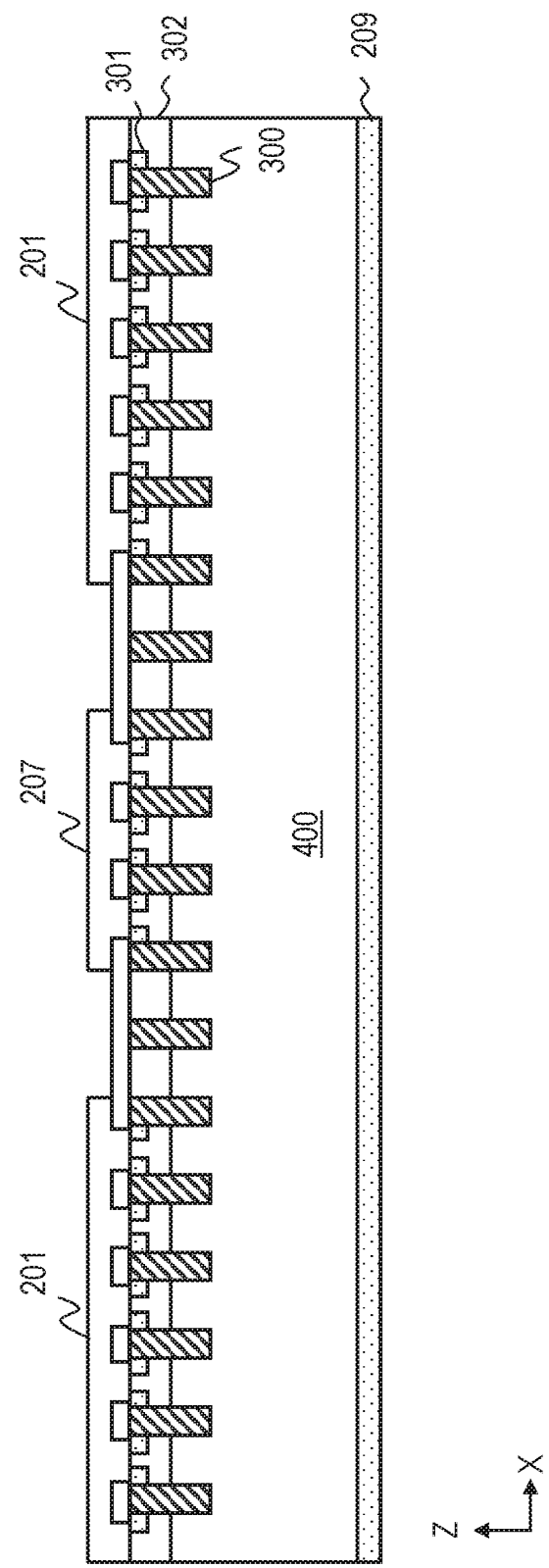
FIG. 4 is a structural diagram of a sensing MOSFET according to the first embodiment.

Next, the construction of the sense MOSFET 103 will be described with reference to FIGS. 3 and 4. FIG. 3 is an enlarged plan view around the source pad 206 and the source electrode 207 where the sense MOSFET 103 is formed. FIG. 4 is a cross-sectional view along E-E' line of FIG. 3. As shown in FIGS. 3 and 4, semiconductor chip 200 has a trench gate 300, an N+-type source layer 301, a P-type base layer 302, and an N-type semiconductor substrate 400. Semiconductor chip 200 is a structure similar to a typical vertical power MOSFET, a detailed description thereof will be omitted. The simplest device isolation method between the power MOSFET 102 and the sense MOSFET 103 is to form an invalid area with a silicon layer that is not doped the N+-type source layer 301, and to separate an aluminum interconnect layer by patterning. Thus, the power MOSFET 102 and the sense MOSFET 103 have a common gate terminal and a common drain terminal. Also, each of the power MOSFET 102 and the sense MOSFET 103 has independent source terminal, respectively.

Figure 5:
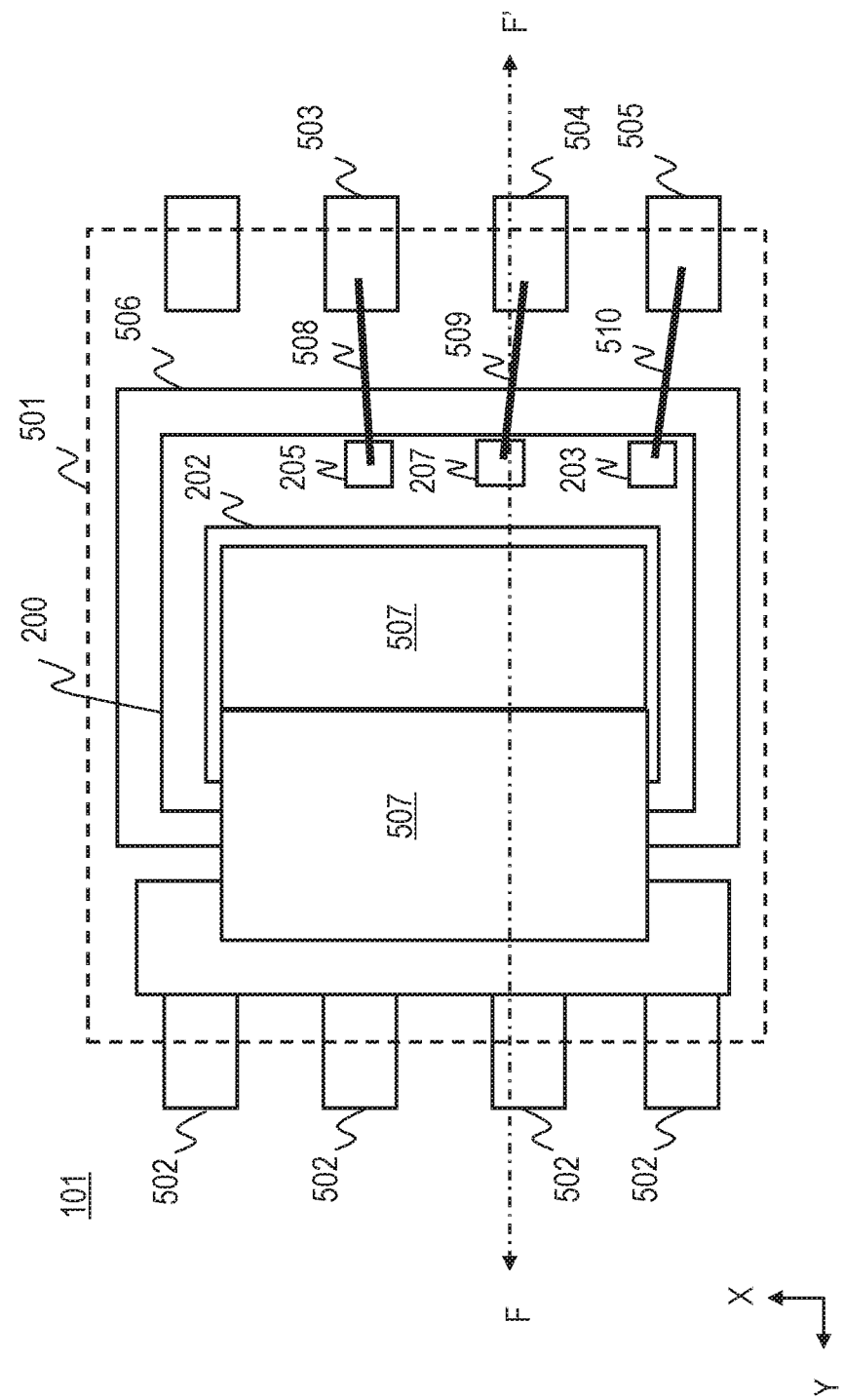
FIG. 5 is a structural diagram of a semiconductor device according to the first embodiment.
Figure 6:
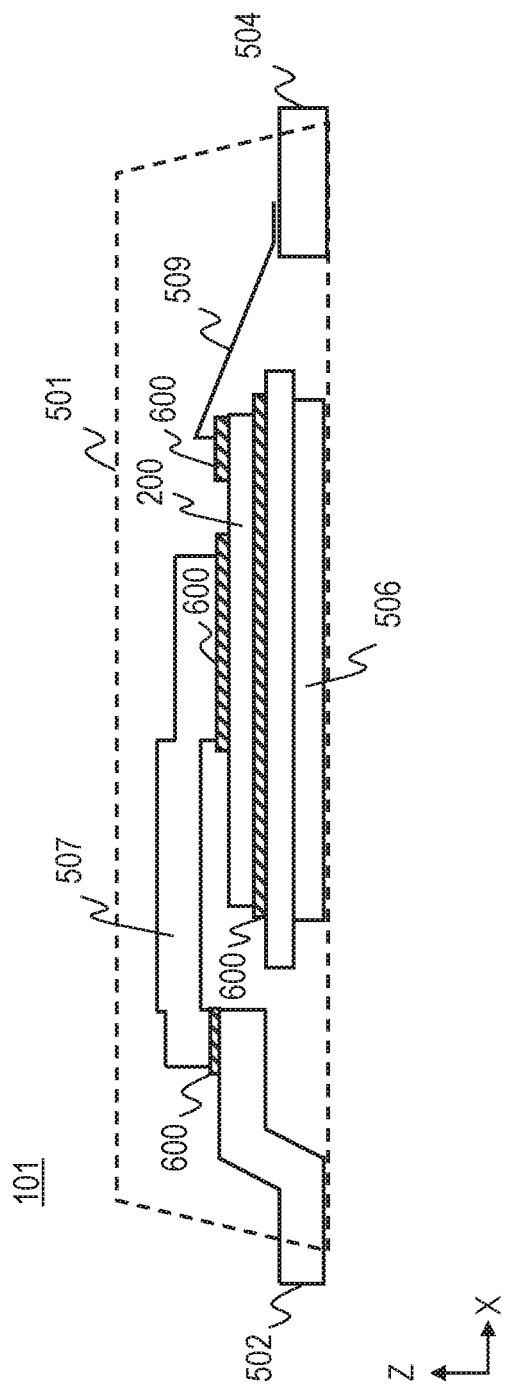
FIG. 6 is a structural diagram of the semiconductor device according to the first embodiment.

Next, a structure of semiconductor device (package) 101 mounting the semiconductor chip 200 will be described with reference to FIGS. 5 and 6. FIG. 6 is a cross-sectional view along F-F' line of FIG. 5. The semiconductor chip 200 is sealed with a sealing portion (resin) 501. A connecting portion 507 (first connecting portion) is coupled to the source pad 202 of the semiconductor chip 200 (power MOSFET 102). The connecting portion 507 of FIG. 5 is a metal plate, it may be a wire. The connecting portion 507 is coupled to the four lead frames 502 which are source terminals (first source terminals) of semiconductor device 101. The Kelvin pad 205 of the semiconductor chip 200 is coupled to a lead frame 503, which is the Kelvin terminal of semiconductor device 101, using a wire 508. The source pad 207 of the semiconductor chip 200 (sense MOSFET 103) is coupled to a lead frame 504, which is a source terminal (second source terminal) of the semiconductor device 101 for sensing, using a wire 509 (second connecting portion). The gate pad 203 is coupled to a lead frame 505, which is the gate terminal of semiconductor device 101, using a wire 510. The drain pad 209 on the back surface of the semiconductor chip 200 is coupled to the drain terminal 506 of semiconductor device 101. For each connection, a bonding material 600 typified by solder, Ag paste, or the like is used.

Figure 7:
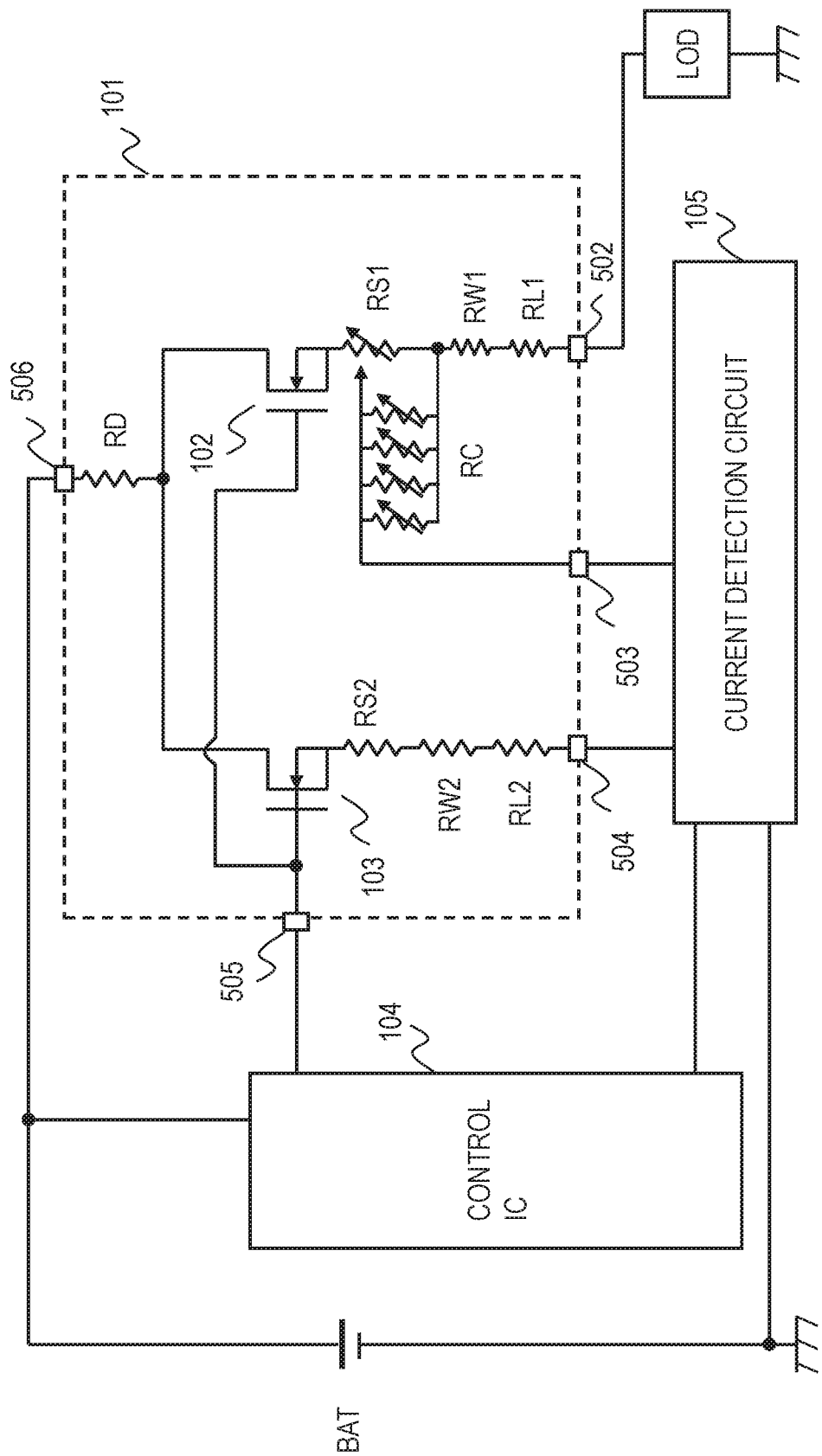
FIG. 7 is a circuit diagram of the semiconductor chip according to the first embodiment.
Figure 23:
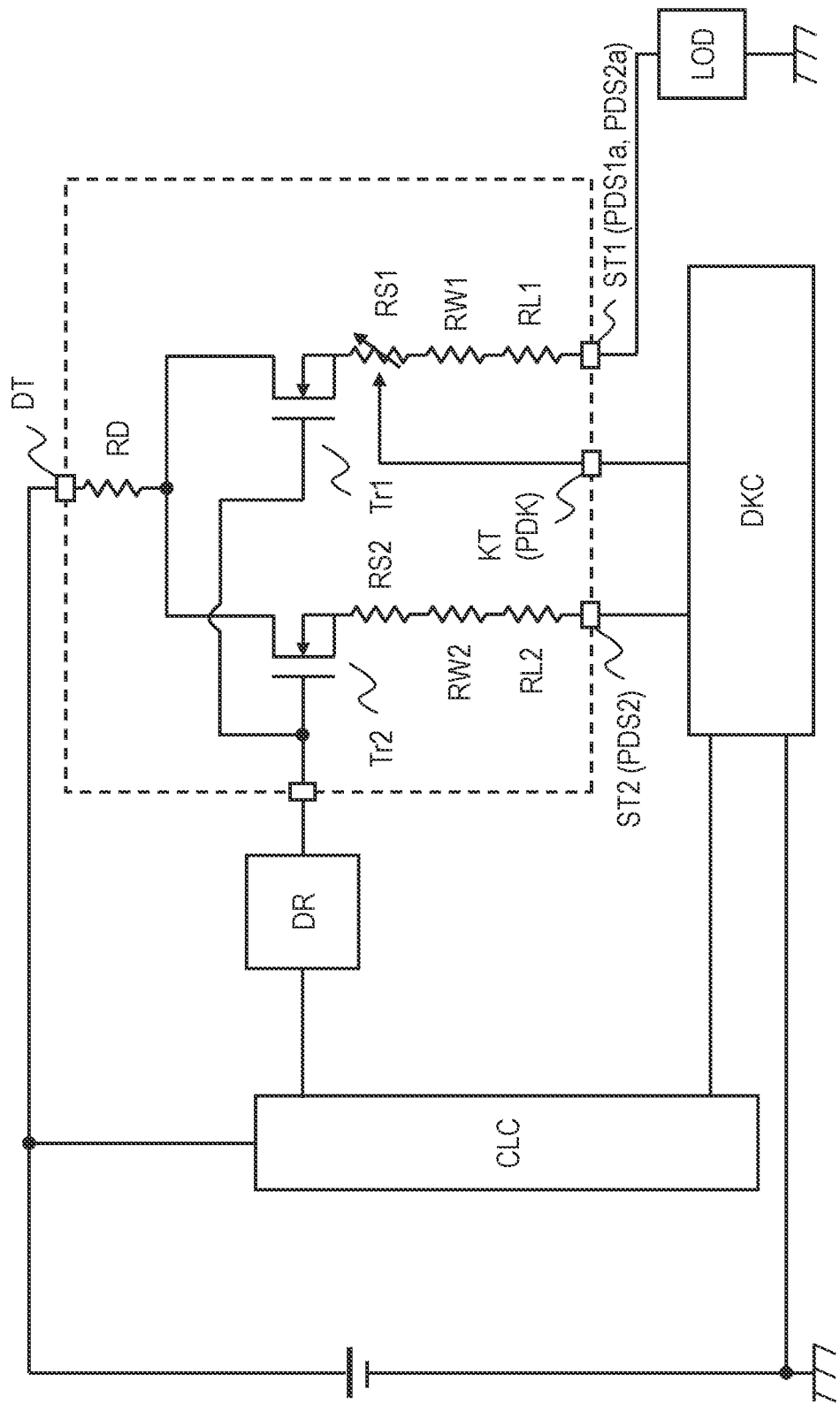
FIG. 23 is a schematic diagram of PRIOR ART.

Next, a circuit of the present first embodiment will be described in detail with reference to FIG. 7. FIG. 7 is an equivalent circuit diagram of the semiconductor chip 200 in consideration of the metal resistance. As in FIG. 23, RL1 represents a metal resistance of the lead frame 502. RL2 represents a metal resistance of the lead frame 504. RW1 represents a metal resistance of the connecting portion 507. RW2 represents a metal resistance of the wire 509. RS1 represents the resistance of the current path extending from the connecting position of the connecting portion 507 in the XY plane of the source electrode 201. RS2 represents the resistance of the current path from the connecting position of the wire 509 to the source of the sense MOSFET 103. RC, in measuring the voltage using the Kelvin terminal described above (four-terminal method), is an image of the unaffected resistance (Rcancel of Equation 4). The reason why RC is composed of four variable resistors is that, in this first embodiment, there are four source-potential extraction ports (A-D).

Figure 8:
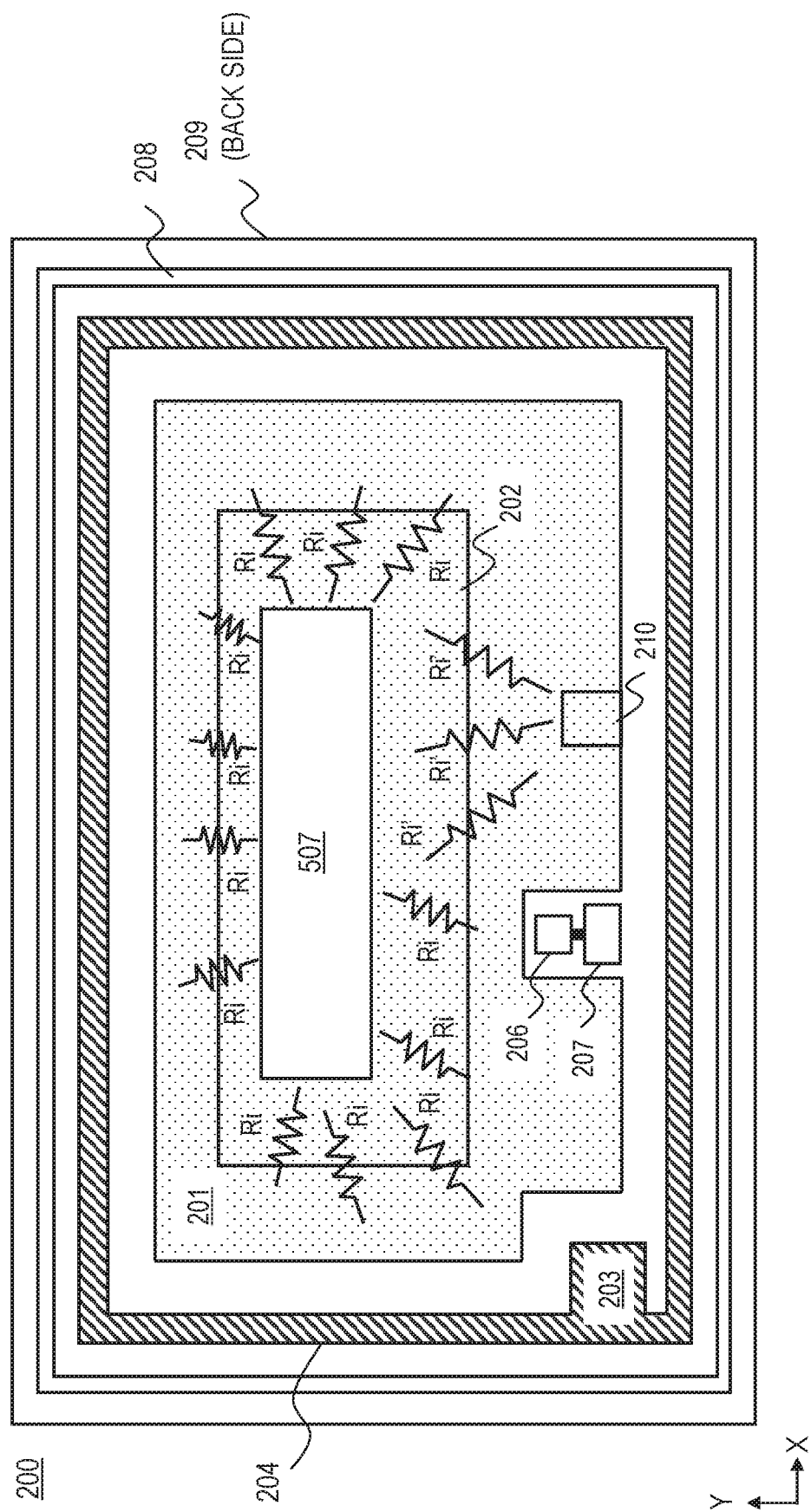
FIG. 8 is an image diagram for explaining the conventional technique.

Further description will be made with reference to FIGS. 8 and 9. FIG. 8 is an image diagram for explaining a conventional technique. In FIG. 8, the Kelvin pad 210 is provided on the source electrode 202. In FIG. 8, there are no source-potential extraction ports A to D and wires MA to MD of this first embodiment. FIG. 8 shows an image of the plurality of resistors Ri diffusing from the connecting portion 507 to the power MOSFET 102 through the source pad 202 and the source electrode 201. Resistor Ri' shows an image of the resistance that contributes (neighbors) to the kelvin pad 210 among the plurality of resistors Ri. Resistor Ri corresponds to RS1 in Equation 4. The resistor Ri' corresponds to Rcancel of Equation 4.

Figure 9:
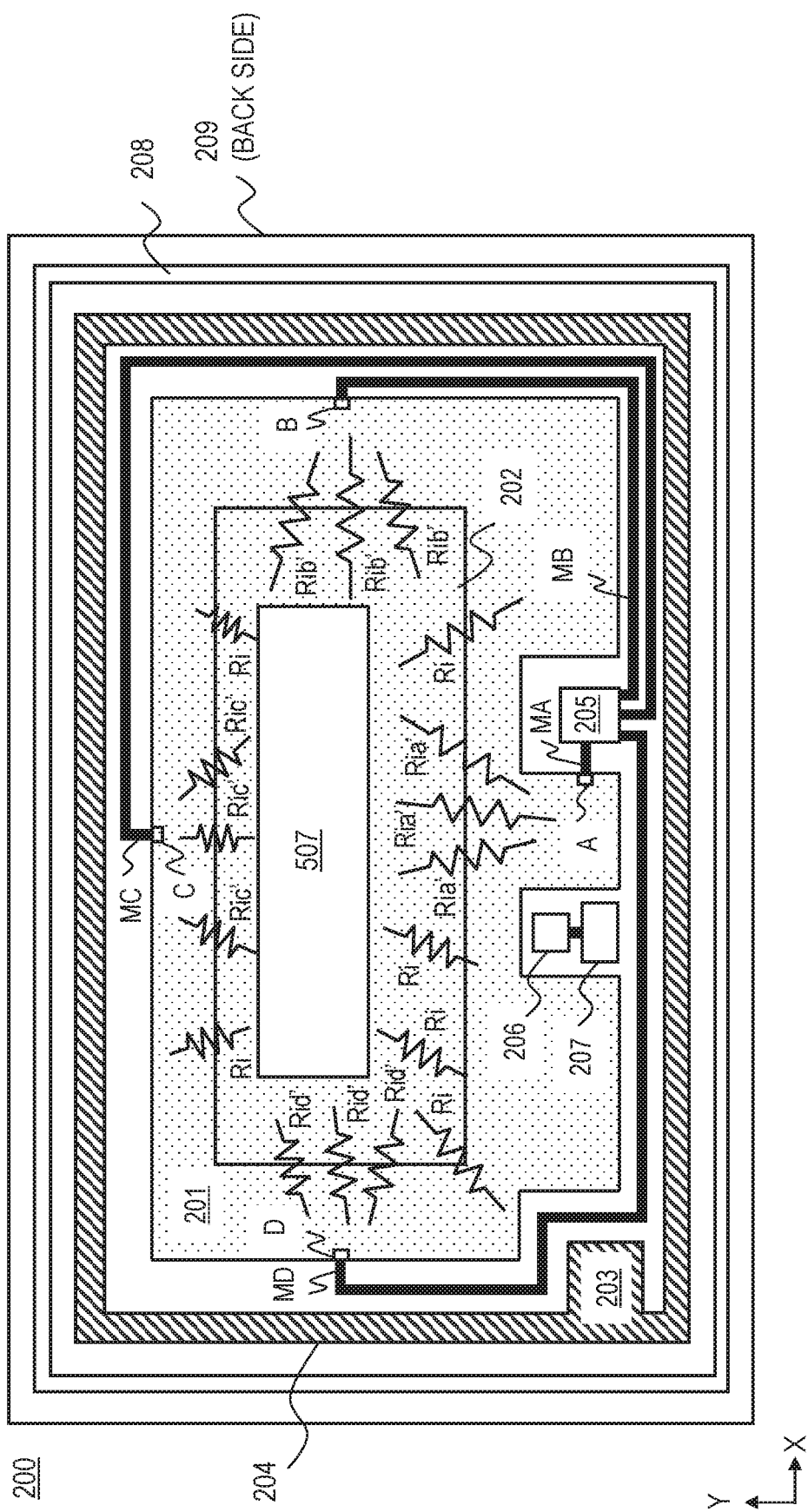
FIG. 9 is an image diagram for explaining the first embodiment.

FIG. 9 is an image diagram for explaining the present first embodiment. As in FIG. 8, it shows an image of the plurality of resistors Ri diffusing from the connecting portion 507 to the power MOSFET 102 through the source pad 202 and the source electrode 201. Resistor Ria', among the plurality of resistors Ri, shows an image of the resistor contributing (neighboring) to the source potential extraction port A. The same applies to the resistors Rib' to Rid'. The above-described variable resistor RC is composed of Ria'–Rid' coupled in parallel.

In the conventional technique of FIG. 8, as described above, when the connection position of the connecting portion 507 varies, Ri' (Rcancel) varies, and the sensing ratio varies. On the other hand, in the first embodiment, the source potential extraction ports A to D are provided so as to surround the source pad 202. For example, it is assumed that the connecting portion 507 is connected to a position close to the source potential extraction port A. In this case, the connecting portion 507 is inevitably connected to a position far from the source potential extraction port C, as compared with the source potential extraction port A. Considering this situation as a resistor, Ria' becomes smaller and Ric' becomes larger accordingly. The same applies to Rib' and Rid'. That is, even if the position of the connecting portion 507 varies, RC (Rcancel) can be a constant resistance at all times. Therefore, in the first embodiment, even if the connection position of the connecting portion 507 varies, the effect on the sensing ratio can be suppressed.

Figure 10:
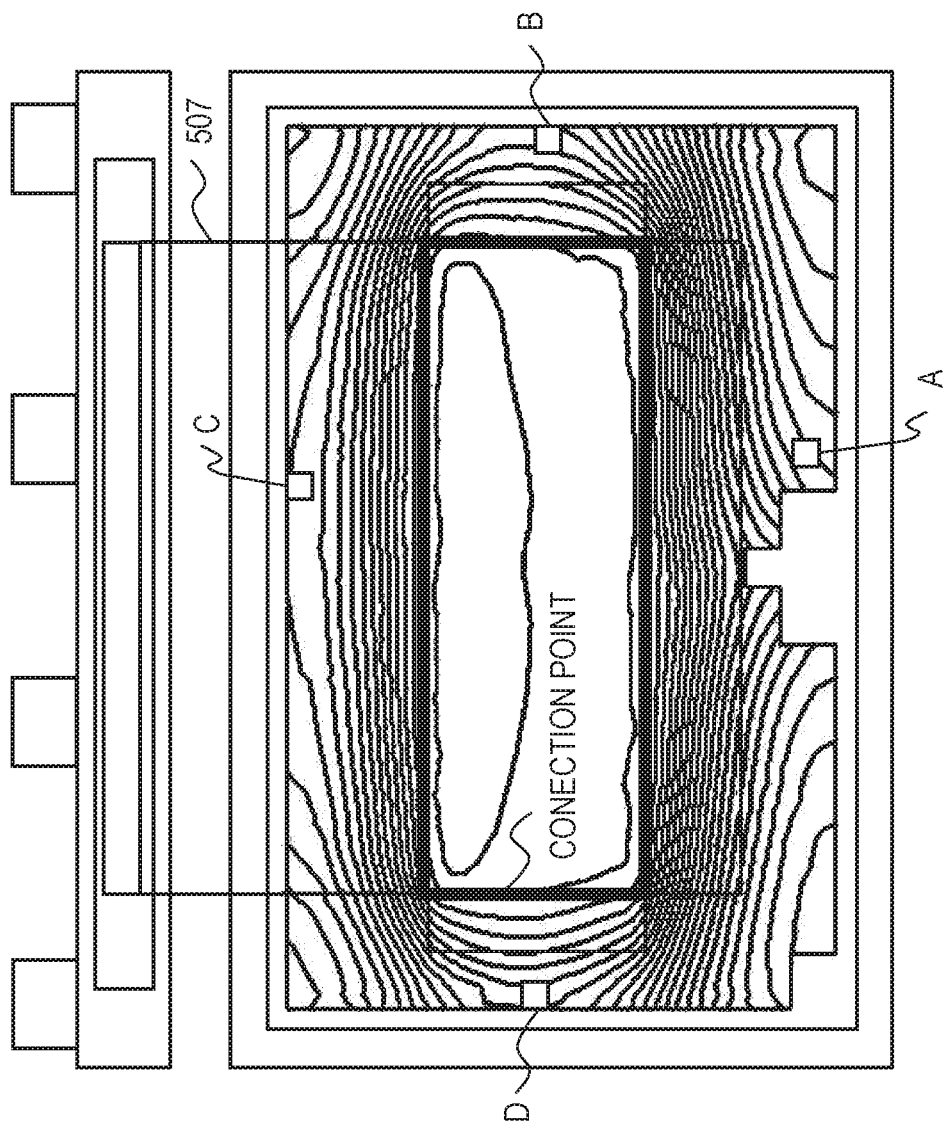
FIG. 10 is a potential profile diagram of the semiconductor chip according to the first embodiment.

The effects of present embodiment will be further explained with reference to FIGS. 10 to 15. FIG. 10 shows a potential distribution on the source electrode 201 by an equipotential line when a current of 1 A flows to the source electrode 201. FIG. 10 shows a source potential extraction port A (Kelvin pad) in the prior art and source potential extraction ports B to D described in the first embodiment. As shown in FIG. 10, the connection portion between the connecting portion 507 and the source pad 202 has a substantially uniform potential. On the other hand, the potential at the end portion of the source electrode 201 decreases.

FIG. 11 shows voltage values at each point when a current of 1 A flows to the source electrode 201 in cases where the connecting position of the connecting portion 507 is in the center of the source pad 202, is shifted by +0.15 mm in the Y direction, is shifted by −0.15 mm in the Y direction. Since the voltage values are the voltage values at the time of 1A, it can be said that the voltage values substantially represent Ria' to Rid'.

As shown in FIG. 11, by the connection position of the connecting portion 507 is shifted, it can be seen that the voltage values of the source potential extraction ports A to D are varied. If the connection position of the connecting portion 507 is shifted +0.15 mm in the Y direction, the distance between the connecting portion 507 and the source potential extraction port A is increased, the distance between the connecting portion 507 and the source potential extraction port C is reduced. As a result, the voltage value of the source potential extraction port A increases (from 0.380 to 0.449), and the voltage value of the source potential extraction port C decreases (from 0.299 to 0.239). When the connection position of the connecting portion 507 is shifted by −0.15 mm in the Y direction, the opposite result is obtained. Focusing solely on the source potential extraction port A, the variation of the voltage value (+18.2%, −17.1%) is large. On the other hand, when the average of the voltage values of the source potential extraction ports A to D is examined, the fluctuations of the voltage values (+1.8% and −1.9%) are small. The case focusing only on the source potential extraction port A corresponds to the prior art. The case focusing on the averaging of the source-potential extraction ports A to D corresponds to this first embodiment. Therefore, it is possible to confirm the effect of suppressing the variation of the sensing ratio according to the present first embodiment.

Figure 12:
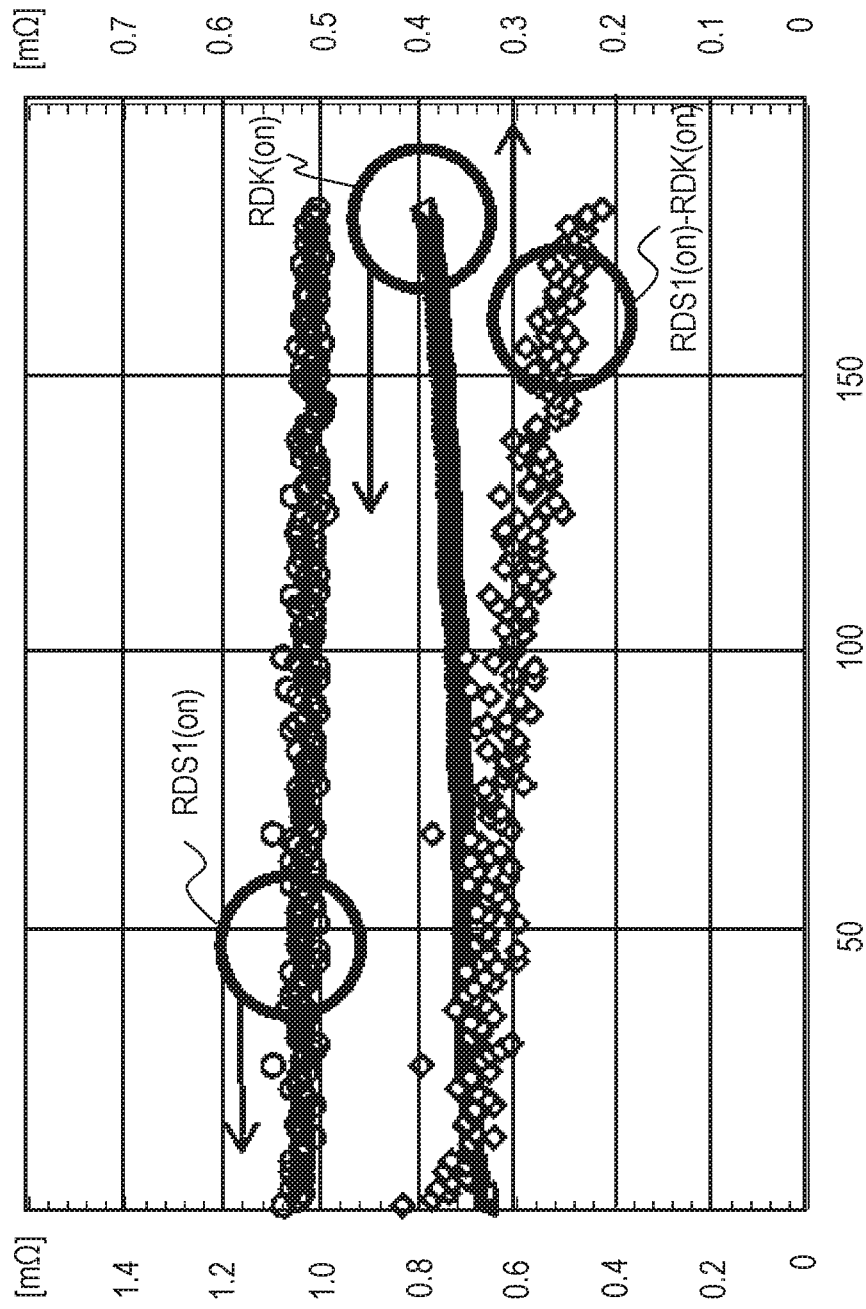
FIG. 12 is a graph for explaining the prior art.
Figure 13:
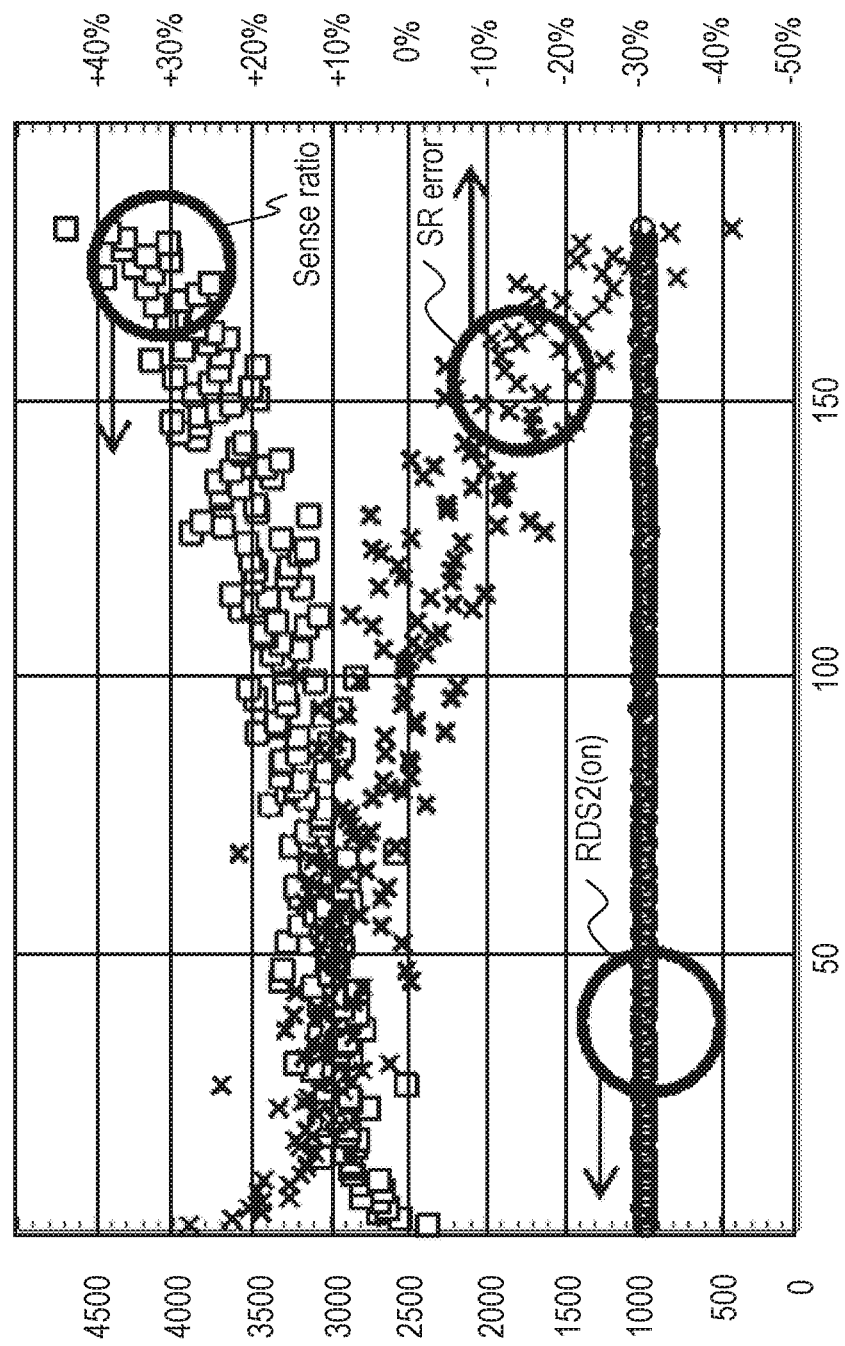
FIG. 13 is a graph for explaining the prior art.
Figure 14:
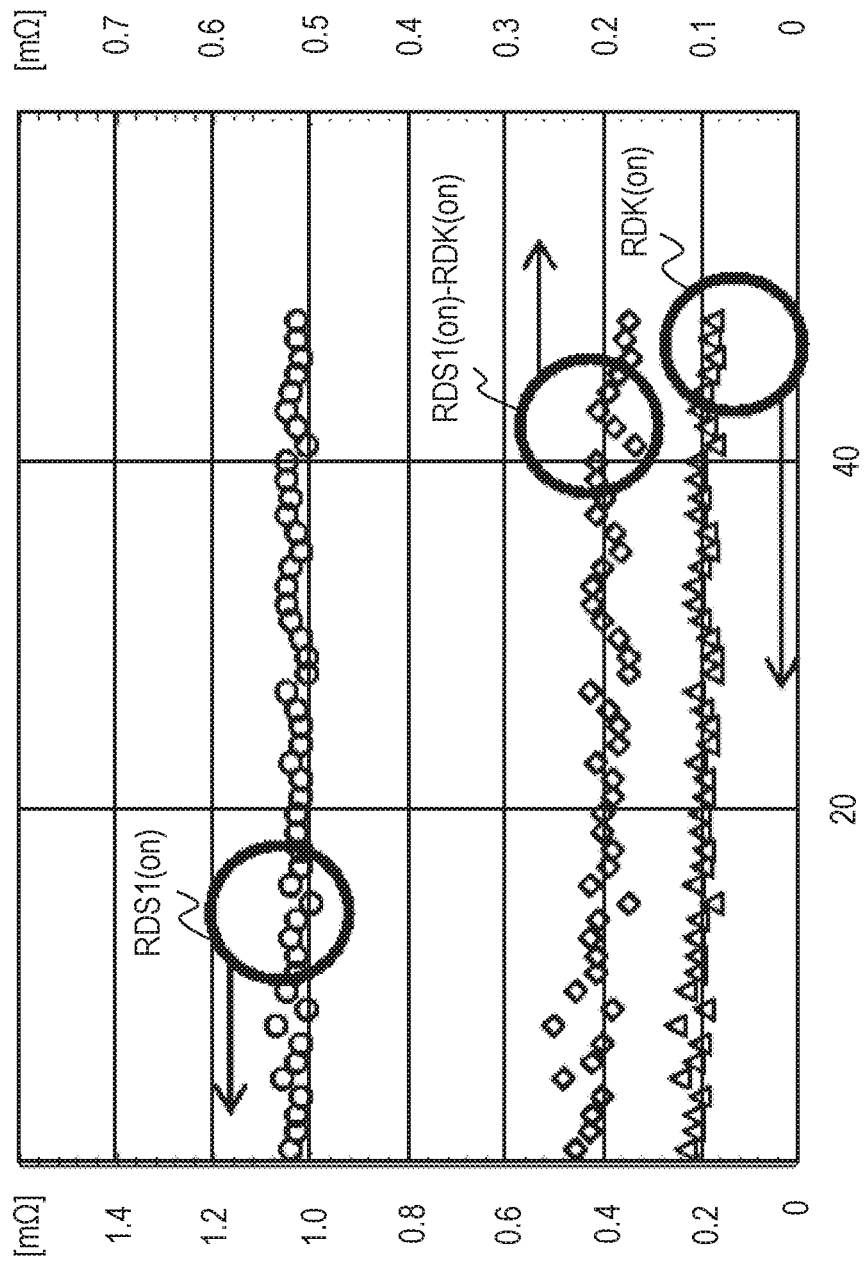
FIG. 14 is a graph for explaining the first embodiment.
Figure 15:
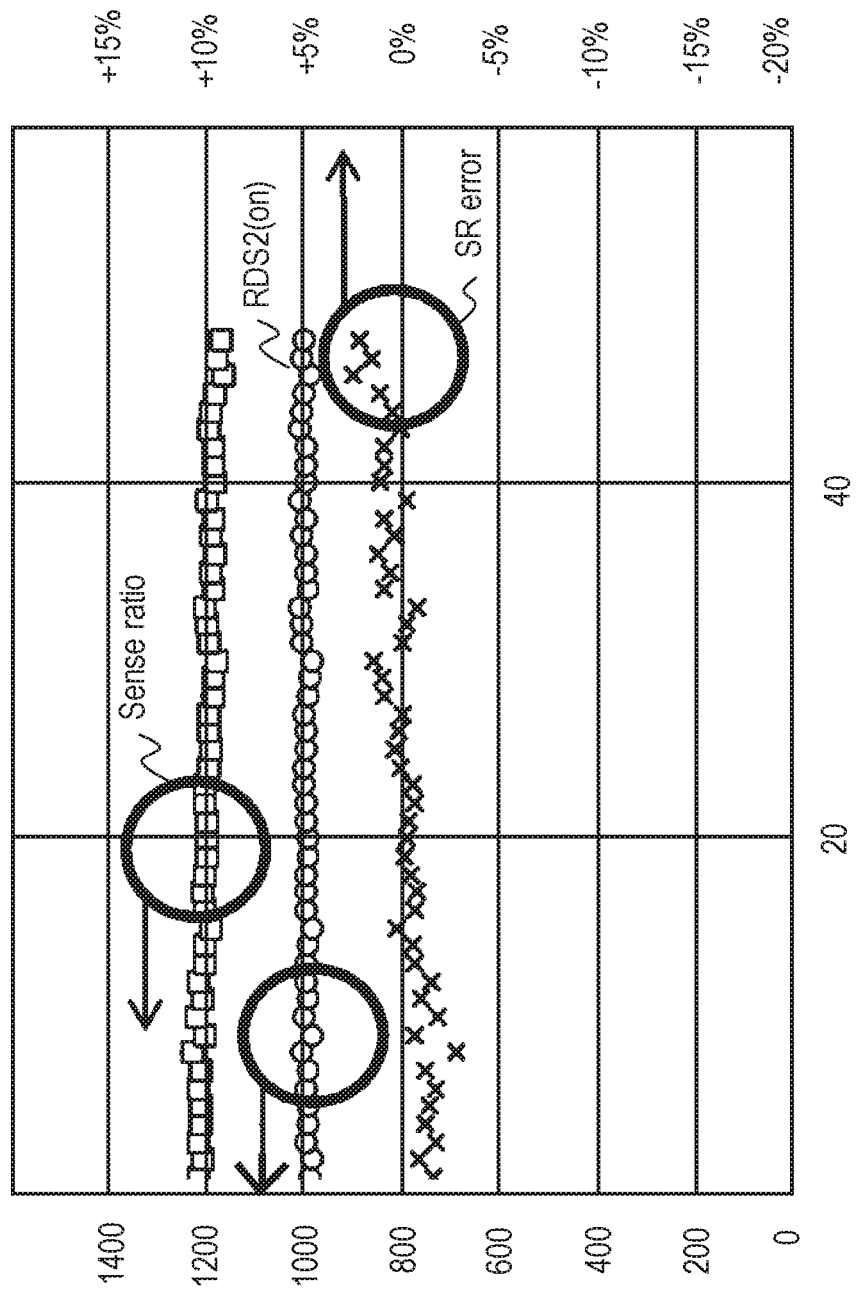
FIG. 15 is a graph for explaining the first embodiment.

FIGS. 12-15 are graphs normalizing the results of measurements using a plurality of semiconductor devices in the prior art and in the present first embodiment. The horizontal axis of each graph indicates the individual identification number. FIGS. 12 and 13 are graphs of the prior art. FIGS. 14 and 15 are graphs of first embodiment. Referring to FIG. 12, RDS1(on) (the drain-to-source resistance when the power MOSFET is on) is seen to be reduced by about 5%. RDK(on) (the resistance between drain and kelvin when the power MOSFET is on) is increased by about 33%. Referring to FIG. 13, RDS2 (on) (the drain-source resistance when the sense MOSFET is on) is less variable. However, since the variation of RDK(on) is large, the sense ratio fluctuates greatly. SR error shows the error from the average value of the sense-ratio. SR error has a variation of +29% to −41%, which is larger than the variation required for current detection accuracy (±10%).

On the other hand, in the first embodiment, as shown in FIGS. 14 and 15, since the variations of RDS1(on), RDK (on), and RDS2(on) are small, the variation of the sense ratios is small. SR error is about ±3%, which satisfies the required current detection accuracy.

As described above, in the semiconductor chip 200 of the first embodiment, source potential extraction ports A to D is provided to the source electrode 201 of the power MOSFET 102. Each of the source potential extraction ports A to D is connected to the Kelvin pad 205 of the power MOSFET 102 by wires MA to MD. Thus, even if the connection position of the connecting portion 507 (metal plate or wire) varies, it is possible to suppress the influence on the sense ratio.

In this first embodiment, four source-potential extraction ports are provided. Four or more source-potential extraction ports may be used.

Second Embodiment

Figure 16:
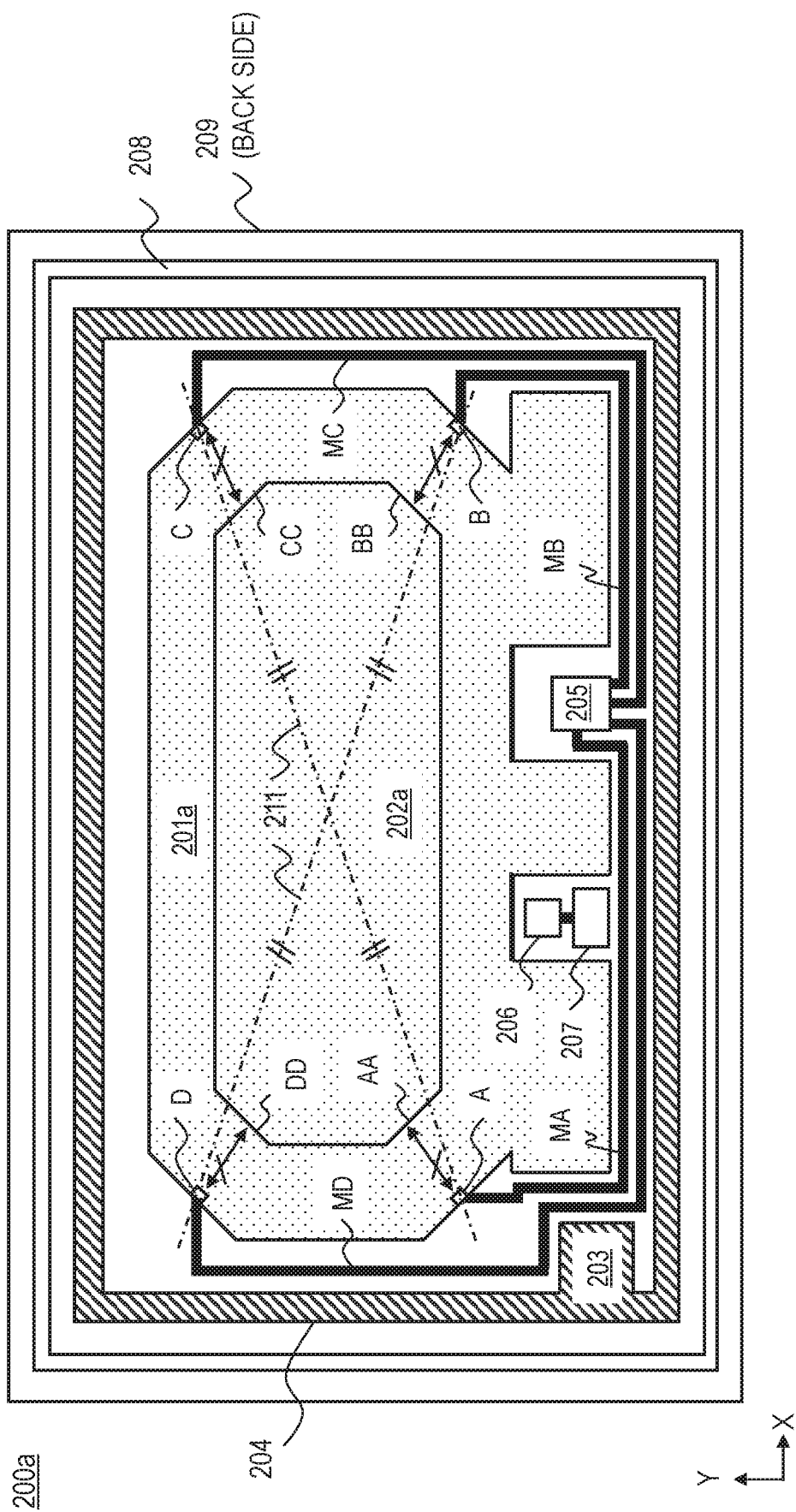
FIG. 16 is a plan view of a semiconductor chip according to a second embodiment.
Figure 17:
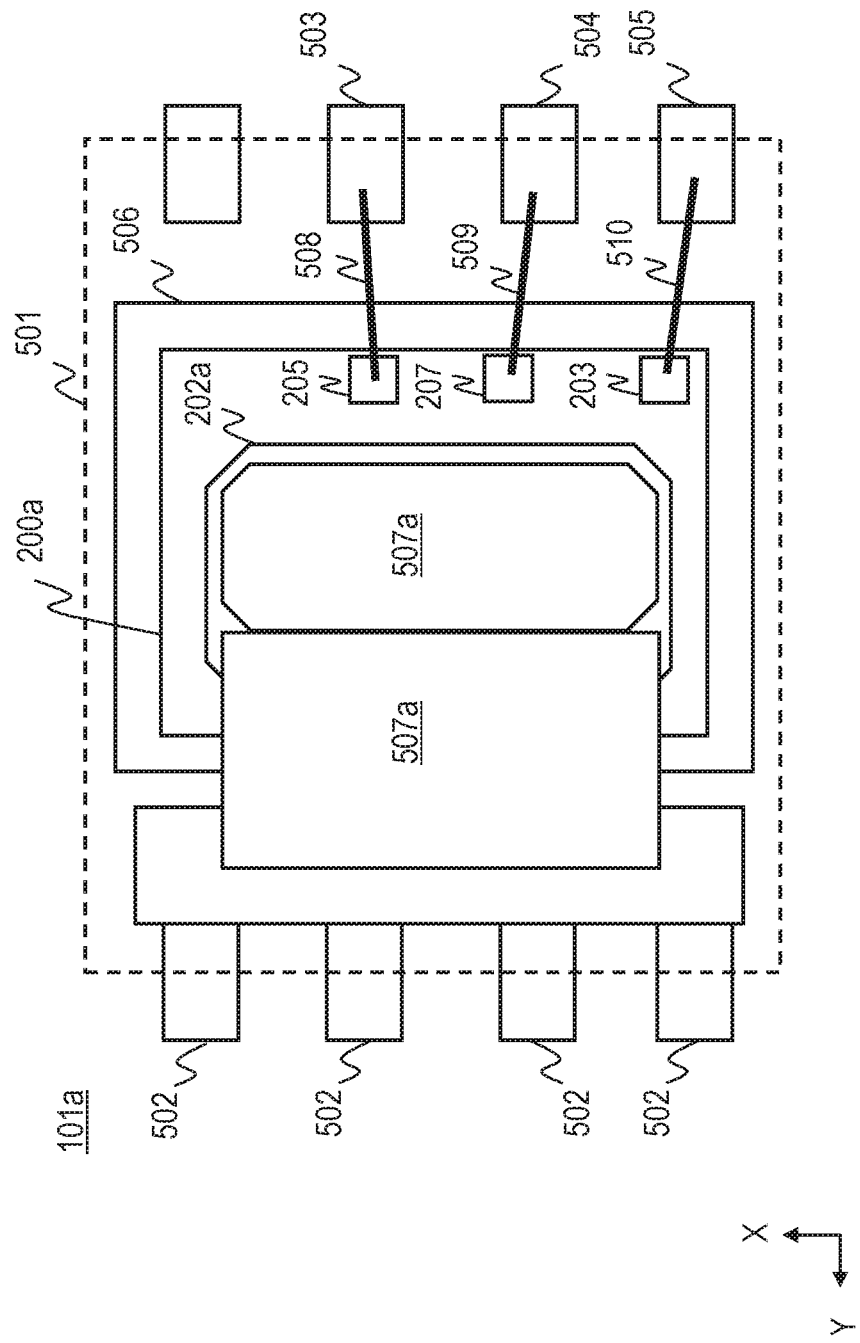
FIG. 17 is a structural diagram of a semiconductor device according to the second embodiment.

FIG. 16 is a plan view of a semiconductor chip 200a according to second embodiment. FIG. 17 is a structural diagram of a semiconductor device 101a having the semiconductor chip 200a.

The difference from first embodiment is the shapes of the source electrodes 201a and the source pad 202a and the locations of the source potential extraction ports A to D. Except for these, it is the same as first embodiment, and therefore detailed descriptions thereof are omitted.

As shown in FIG. 16, the source pad 202a has a shape in which four corners are chamfered. A portion of the source electrode 201a is shaped to surround the source pad 202a. The source potential extraction ports A to D are formed on an extension line of a diagonal line 211 of the source pad 202a (of the four corners before chamfering the source pad 202a) in the source electrode 201a (are formed on four hypotenuse sides of the source electrode 201a). In other words, the source pad 202a is an octagonal having four sides AA to DD oblique to one side of the outer periphery of the semiconductor chip 200a. The source electrode 201a has oblique sides corresponding to the four sides AA to DD, and the source potential extraction ports A to D are formed on the four oblique sides. Further, it is desirable that the distance from each of the source potential extraction ports A to D to the source pad 202a is the same. Like first embodiment, each of the source potential extraction ports A to D is connected to the kelvin pad 205 by wires MA to MD.

As shown in FIG. 17, a connecting portion 507a also preferably has a shape (octagonal shape) that is chamfered in accordance with the source pad 202a.

Since the source electrode 201a, the source pad 202a, and the connecting portion 507a have a chamfered shape, it can be expected that the potentials at the source potential extraction ports A to D become equal potentials. This is because the source potential extraction ports A to D can be expected to be formed on the equipotential lines described with reference to FIG. 10. If it can be expected that the potentials of the source-potential extraction ports A to D become equal potentials, it is possible to improve the accuracy of calculation of the design value of RDK(on) and the accuracy of calculation of the design value of the sensing ratio at the time of designing Rcancel and RDK(on), and it is also possible to improve the accuracy of calculation of the design value of the sensing ratio.

It is needless to say that the same effects as those of first embodiment can be obtained in this second embodiment.

As described above, in the semiconductor chip 200a of the second embodiment, in addition to the effects of first embodiment, the accuracy of calculating the design value of the sensing ratio at the time of design can be further improved.

Third Embodiment

Figure 18:
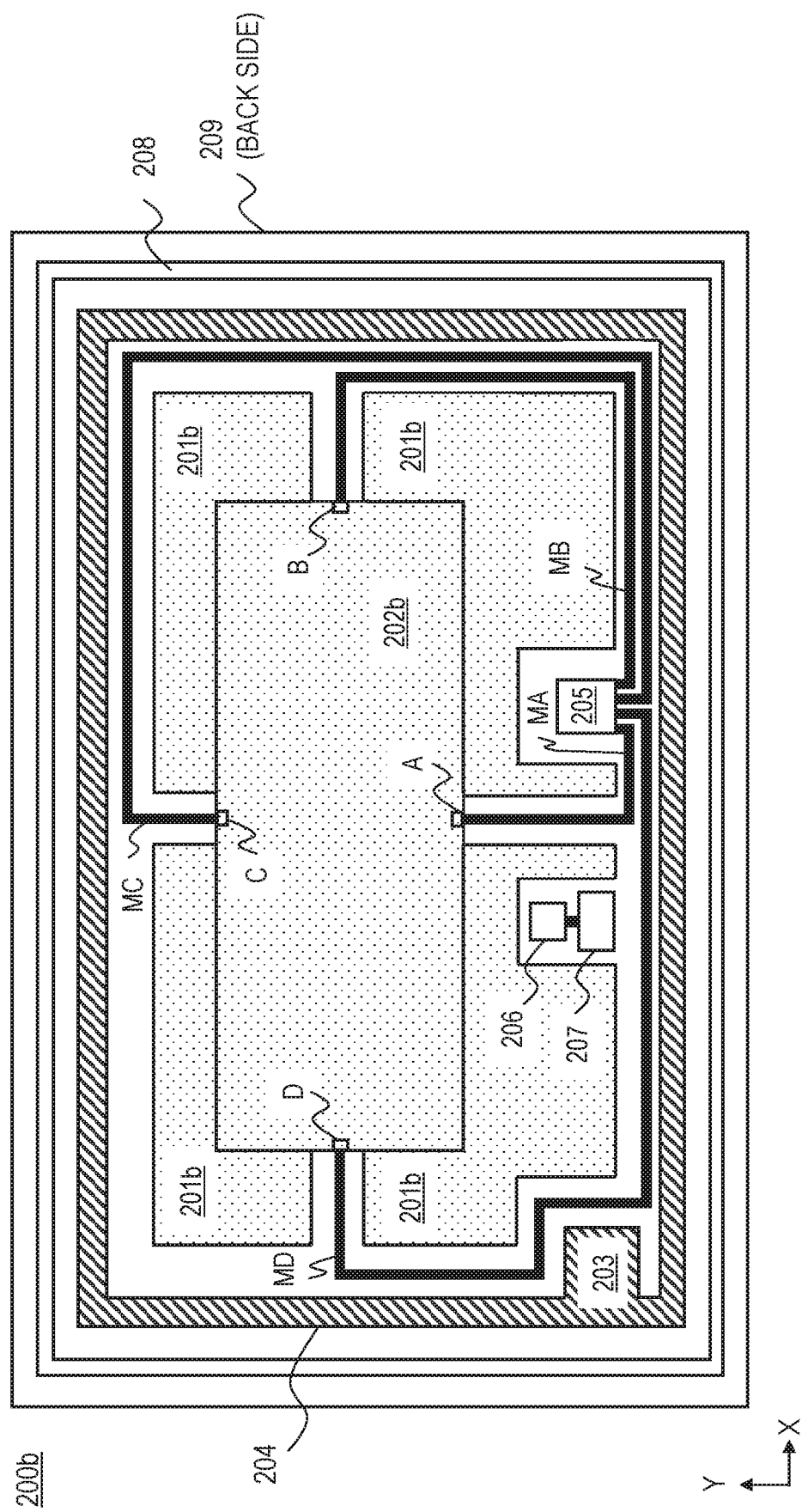
FIG. 18 is a plan view of a semiconductor chip according to a third embodiment.

FIG. 18 is a plan view of a semiconductor chip 200b according to third embodiment. The difference from first and second embodiments is that, as shown in FIG. 18, source potential extraction ports A to D are formed on the perimeter of rectangular source pad 202b. Further, in the source electrode 201b, four slits are formed in accordance with the source potential extraction ports A to D. Each of the source potential extraction ports A to D is connected to the kelvin pad 205 by wires MA to MD. Except for these, it is the same as first embodiment, and therefore detailed descriptions thereof are omitted.

With the structure as shown in FIG. 18, the potential immediately below the source pad 202b can be extracted from the source potential extraction ports A to D. In other words, the expected value of RS1−Rcancel in Equation 4 can be substantially 0. Generally, RD (about 0.02 mΩ) is sufficiently smaller than RTr1. Thus, Equation 4 can be approximated to RTr2/RTr1. RTr2 is the on-resistance of the sense MOSFET 103. RTr1 is the on-resistance of the powered MOSFET 102.

It is advantageous that the sense ratio depends only on the on-resistances of the power MOSFET and the sense MOSFET when the temperature dependency of the sense ratio is considered. Impedances of materials each have a temperature coefficient. Each of the impedance of the metal portion and the impedance of the chip portion has a different temperature coefficient. Therefore, when Equation 4 is considered in the prior art, the sensing ratio is temperature-dependent because the material constituting the impedance "RTr2" and the materials constituting the impedance "RD+RTr1+RS1−Rcancel" are different. In the third embodiment, the temperature-dependence of the sensing ratio can be made extremely small.

As described above, in the semiconductor chip 200b of the third embodiment, the temperature dependency of the sensing ratio can be further reduced in addition to the effects of first embodiment.

Fourth Embodiment

Figure 19:
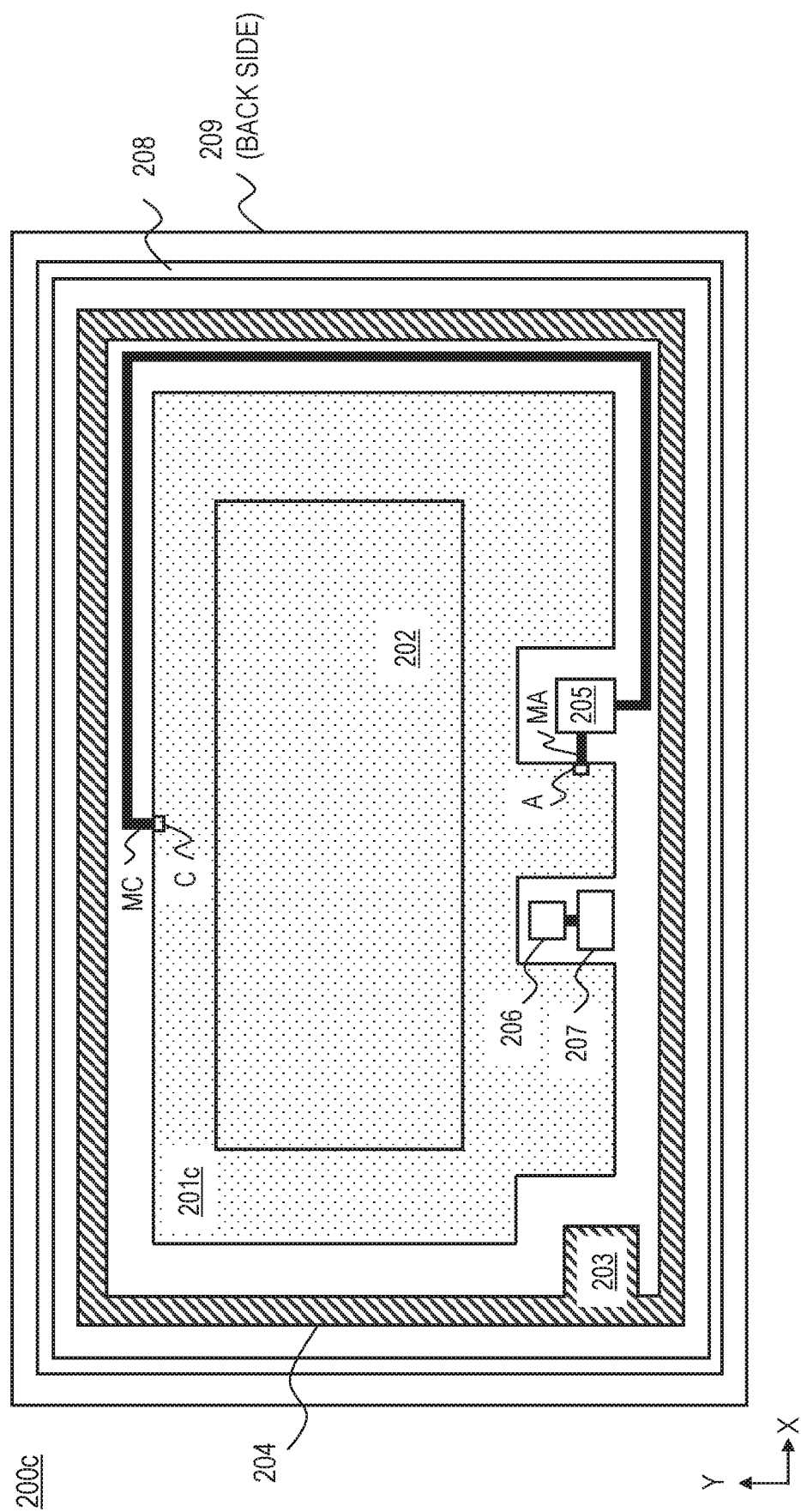
FIG. 19 is a plan view of a semiconductor chip according to a fourth embodiment.

FIG. 19 is a plan view of a semiconductor chip 200c according to fourth embodiment. The difference between the first to third embodiments is that the source-potential extraction ports are at two points A and C.

The source potential extraction port is preferably formed on the side where the equipotential lines described with reference to FIG. 10 are dense in the source electrode 201c. In the case of FIG. 10, it can be seen that the equipotential lines are denser in the vicinity of A and C than in the vicinity of B and D.

Since less wirings are connected to the Kelvin pad 205 from the source potential extraction ports, the area required for wirings is reduced and the effective area of the chip can be increased. As the useful area of the chip increases, the on-resistance of the power MOSFET 102 decreases, and the performance of the semiconductor chip 200c can be improved.

Although FIG. 19 is based on FIG. 2 (first embodiment), the fourth embodiment may be applied to FIG. 16 (second embodiment) or FIG. 18 (third embodiment).

As described above, in the semiconductor chip 200c of the present fourth embodiment, while suppressing a decrease in chip performance, it is possible to suppress variations in the sense ratio.

Fifth Embodiment

Figure 20:
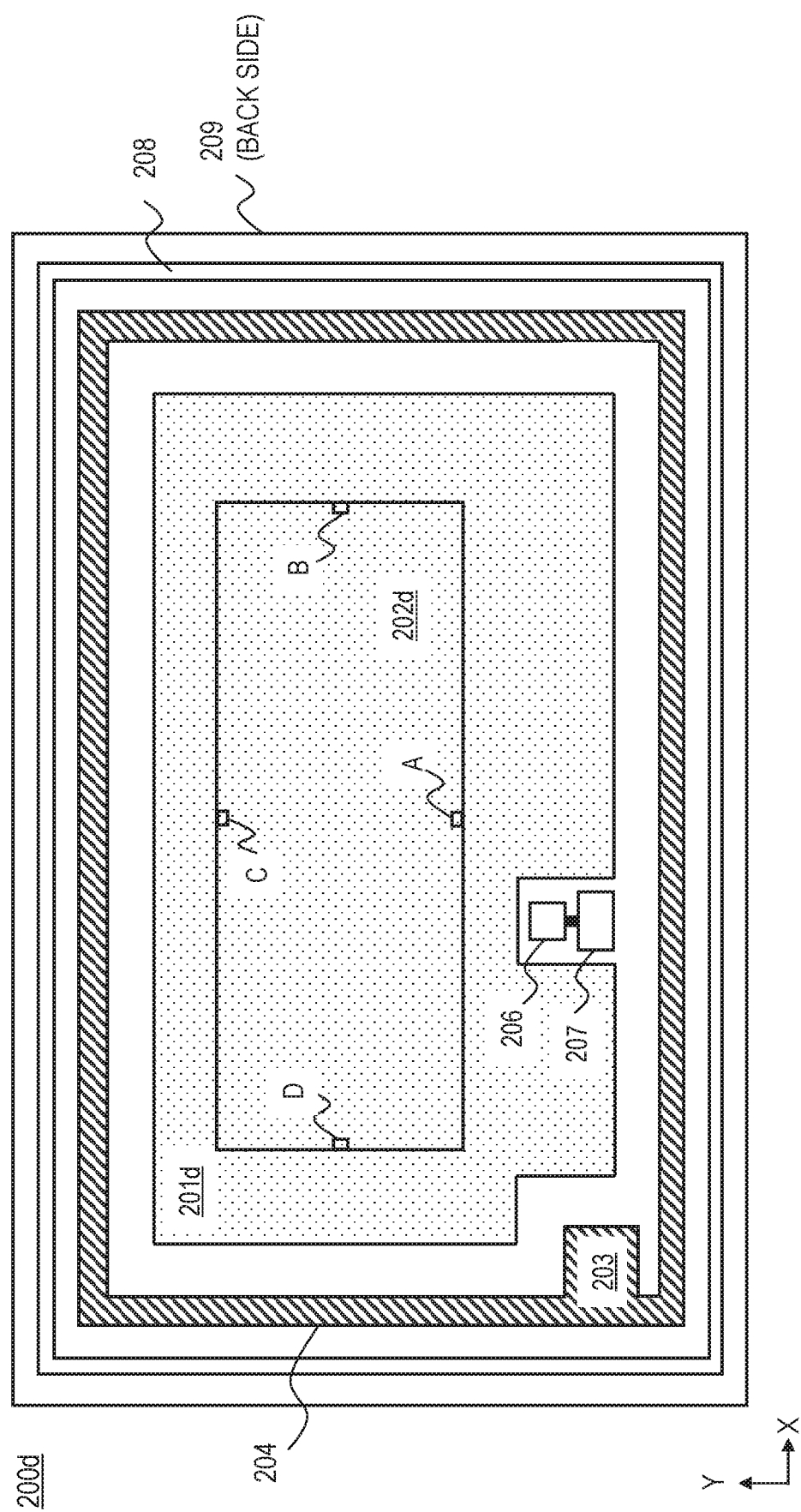
FIG. 20 is a plan view of a semiconductor chip according to a fifth embodiment.
Figure 21:
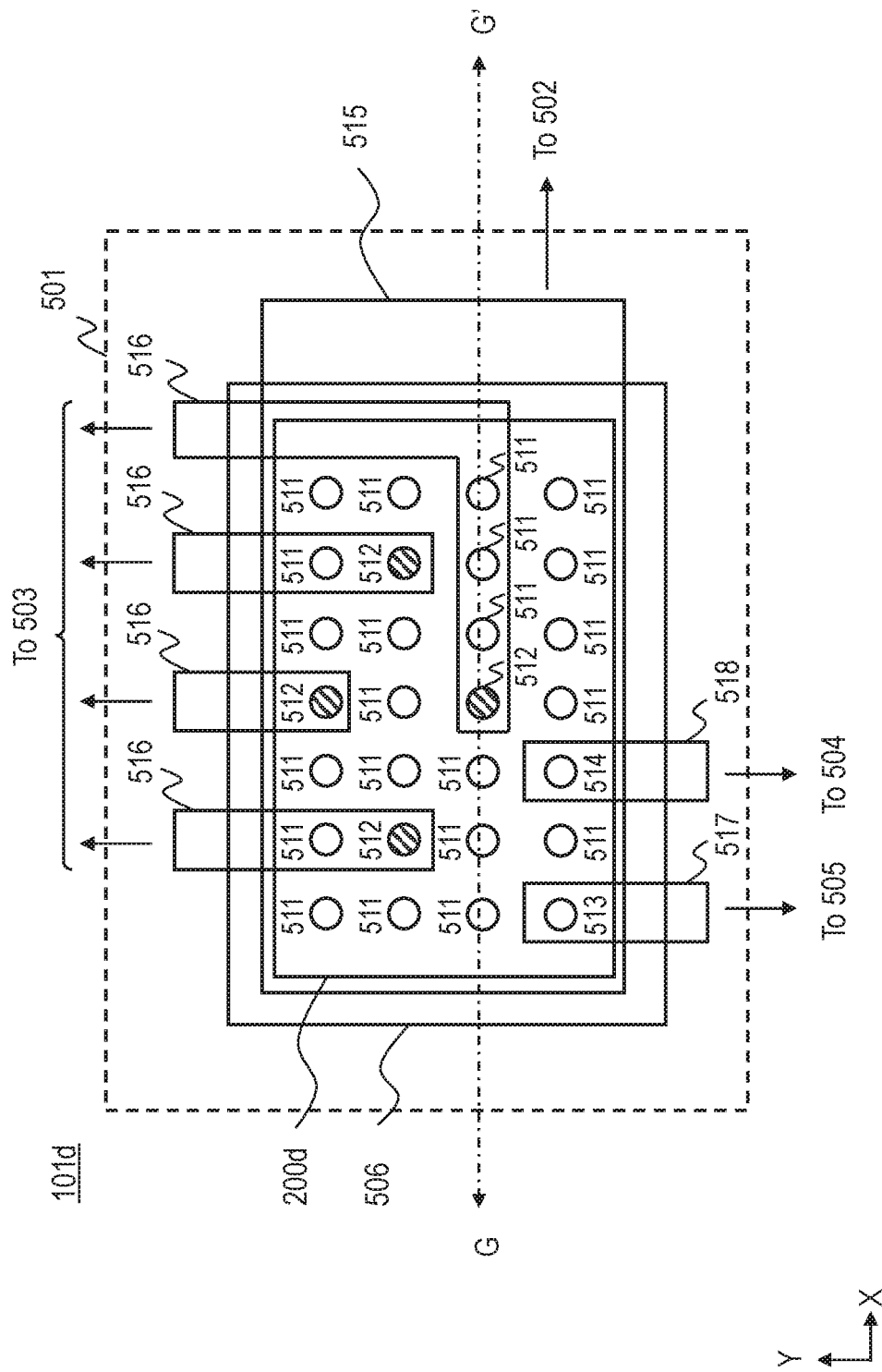
FIG. 21 is a structural diagram of a semiconductor device according to the fifth embodiment.
Figure 22:
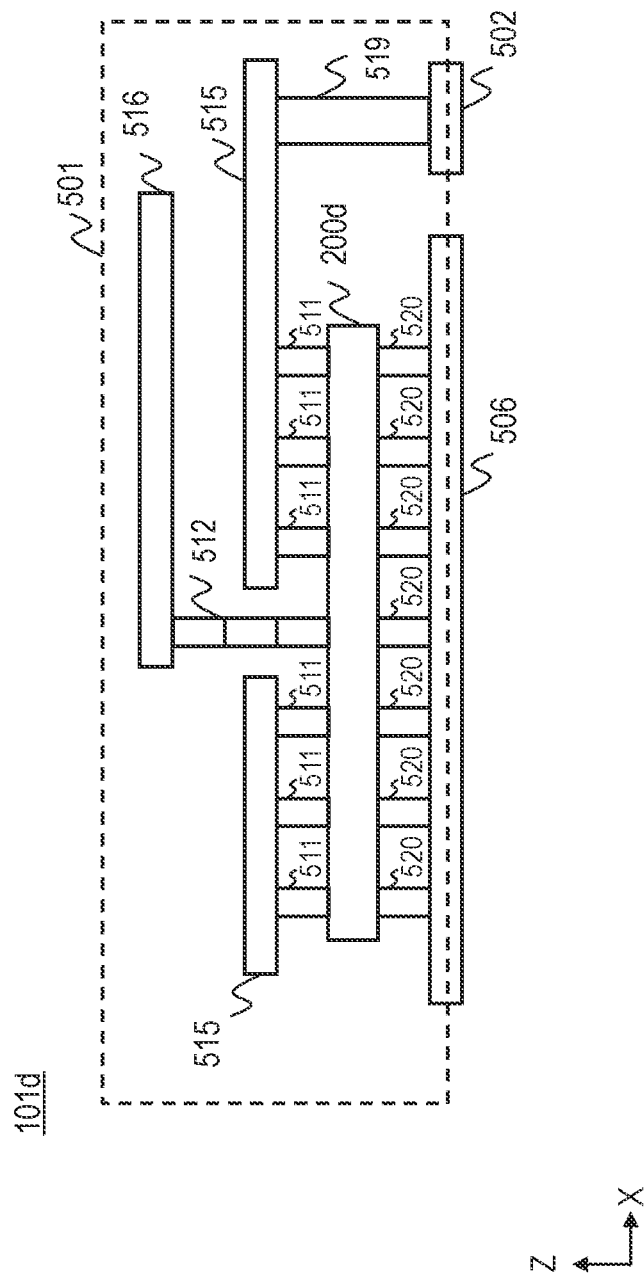
FIG. 22 is a structural diagram of the semiconductor device according to the fifth embodiment.

FIG. 20 is a plan view of a semiconductor chip 200d according to fifth embodiment. FIGS. 21 and 22 are structural diagrams of a semiconductor device 101d having the semiconductor chip 200d. The difference from the first to fourth embodiments is that semiconductor device 101d is an embedded substrate in which the semiconductor chip 200d is embedded in the substrate.

As shown in FIG. 20, source potential extraction ports A-D are formed around source pad 202d. In the semiconductor chip 200d, the wires MA to MD and the Kelvin pad 205 such as first to fourth embodiments are not formed. The source potential extraction ports A-D and the Kelvin terminal 503 are coupled through a via and wiring to be described later.

FIG. 21 is a structural diagram of a semiconductor device 101d having the semiconductor chip 200d. FIG. 22 is a cross-sectional view along the line segment G-G' of FIG. 21. As shown in FIGS. 21 and 22, the source potential extraction ports A to D and the lead frame 503, which is a Kelvin terminal, are coupled through vias 512 and wires 516 provided in the embedded substrate.

Similarly, the source electrode 201d and the lead frame 502 serving as a source terminal are coupled to each other through a vias 511, a wiring 515, and a via 519 provided in the embedded substrate. The gate pad 203 and the lead frame 505, which is a gate terminal, are coupled through a via 513 and a wiring 517 provided in the embedded substrate. The source pad 206 and the lead frame 504, which is a source terminal, is coupled through a via 514 and a wiring 518 provided in the embedded substrate. The drain pads on the back surface of semiconductor device 101d and the drain terminal 506 are coupled by vias 520 provided in the embedded substrate.

The use of the embedded substrate eliminates a need to provide the wires MA to MD and the Kelvin pad 205 in the semiconductor chip 200d. As a result, the effective area of the chip can be increased.

It is needless to say that the same effects as those of first embodiment can be obtained in this fifth embodiment.

As described above, the semiconductor chip 200d of the fifth embodiment can suppress the deterioration of the chip performance in addition to the effects of first embodiment.

It should be noted that the present invention is not limited to the above-mentioned embodiments, and various modifications can be made without departing from the gist thereof.

What is claimed is:
1. A semiconductor device comprising:
a semiconductor chip;
first and second source terminals;
a drain terminal;
a gate terminal; and
a Kelvin terminal, wherein the semiconductor chip comprises:
   a first source electrode coupled to the first source terminal through a first connecting portion;
   a second source electrode coupled to the second source terminal through a second connecting portion;
   a drain electrode coupled to the drain terminal;
   a Kelvin pad coupled to the Kelvin terminal and formed independently of the first source electrode;
   a power MOSFET that has a source coupled to the first source electrode, a drain coupled to the drain electrode and a gate coupled to the gate terminal;
   a sense MOSFET that has a source coupled to the second source electrode, a drain coupled to the drain electrode and a gate coupled to the gate terminal;
   a source pad formed on a portion of the first source electrode and coupled to the first connecting portion;
   a plurality of source potential extraction ports formed around a connection point between the first connecting portion and the source pad; and
   a plurality of wires coupled between the source potential extraction ports and the Kelvin pad.

2. The semiconductor device according to claim 1, wherein the first connecting portion is a wire or a metal plate.

3. The semiconductor device according to claim 1, wherein the plurality of source potential extraction ports is formed to surround the source pad in the first source electrode.

4. The semiconductor device according to claim 3, wherein the source pad is rectangular, and
   wherein the source potential extraction ports include four source potential extraction ports each of which is formed at each of four ends of the first source electrode corresponding to four sides of the source pad.

5. The semiconductor device according to claim 3, wherein the source pad is rectangular and chamfered in shape, and
   wherein the source potential extraction ports include four source potential extraction ports each of which is formed at each of four ends of the first source electrode corresponding to the four chamfered sides of the source pad.

6. The semiconductor device according to claim 3, wherein the source pad is an octangular and has four oblique sides to one side of the semiconductor chip,
   wherein the first source electrode has four oblique sides corresponding to the four oblique sides of the source pad, and
   wherein the source potential extraction ports include four source potential extraction ports each of which is formed at each of the four oblique sides of the first source electrode.

7. The semiconductor device according to claim 1, wherein the source pad is rectangular, and
   wherein the plurality of source potential extraction ports are two source potential extraction ports each of which is formed at each of two ends of the first source electrode corresponding to two opposite sides of the source pad.

8. The semiconductor device according to claim 7, wherein each of the two source potential extraction ports is formed at each of two ends of the first source electrode corresponding to long sides of the source pad.

9. The semiconductor device according to claim 1, wherein the plurality of source potential extraction ports is formed in a peripheral portion in the first source pad, and
   wherein the first source electrode has a slit in each of the plurality of source potential extraction ports.

10. The semiconductor device according to claim 1, wherein the semiconductor chip further comprises a semiconductor substrate,
   wherein the first and second source electrodes are formed on a first surface of the semiconductor substrate, and
   wherein the drain electrode is formed on a second surface of the semiconductor substrate.

11. A semiconductor device comprising:
   a semiconductor chip;
   first and second source terminals;
   a drain terminal;
   a gate terminal; and
   a Kelvin terminal,
   wherein the semiconductor chip comprises:
      a first source electrode coupled to the first source terminal through a first via and a first wire;
      a second source electrode coupled to the second source terminal through a second via and a second wire;
      a drain electrode coupled to the drain terminal;
      a power MOSFET that has a source coupled to the first source electrode, a drain coupled to the drain electrode and a gate coupled to the gate terminal;
      a sense MOSFET that has a source coupled to the second source electrode, a drain coupled to the drain electrode and a gate coupled to the gate terminal; and
      a plurality of source potential extraction ports formed in the first source electrode to surround the first via,
   wherein each of the source potential extraction ports is coupled to the Kelvin terminal through a third via and a third wire.

12. The semiconductor device according to claim 11, wherein the semiconductor device comprises an embedded substrate in which the semiconductor chip is embedded.

13. A control system comprising:
   a semiconductor device that includes first and second source terminals, a drain terminal, a Kelvin terminal and a gate terminal;
   a current detection circuit coupled to the Kelvin terminal and the first source terminal; and
   a control circuit that outputs a control signal to the gate terminal based on a current detected by the current detection circuit,
   wherein the semiconductor device has a semiconductor chip,
   wherein the semiconductor chip comprises:
      a first source electrode coupled to the first source terminal through a first connecting portion;
      a second source electrode coupled to the second source terminal through a second connecting portion;
      a drain electrode coupled to the drain terminal;
      a Kelvin pad coupled to the Kelvin terminal and formed independently of the first source electrode;
      a power MOSFET that has a source coupled to the first source electrode, a drain coupled to the drain electrode and a gate coupled to the gate terminal;
      a sense MOSFET that has a source coupled to the second source electrode, a drain coupled to the drain electrode and a gate coupled to the gate terminal;
      a source pad formed on a portion of the first source electrode and coupled to the first connecting portion;
      a plurality of source potential extraction ports formed around a connection point between the first connecting portion and the source pad; and a plurality of wires coupled between the source potential extraction ports and the Kelvin pad.

* * * * *